US008431637B2

(12) United States Patent
Yoshida

(10) Patent No.: US 8,431,637 B2
(45) Date of Patent: *Apr. 30, 2013

(54) RESIN COMPOSITION FOR LASER ENGRAVING, RELIEF PRINTING PLATE PRECURSOR FOR LASER ENGRAVING, PROCESS FOR PRODUCING RELIEF PRINTING PLATE AND RELIEF PRINTING PLATE

(75) Inventor: Kenta Yoshida, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/172,177

(22) Filed: Jun. 29, 2011

(65) Prior Publication Data
US 2011/0318537 A1 Dec. 29, 2011

(30) Foreign Application Priority Data

Jun. 29, 2010 (JP) ................................. 2010-147657

(51) Int. Cl.
C08K 5/24 (2006.01)
G03C 1/00 (2006.01)
B05D 3/06 (2006.01)
B29C 35/08 (2006.01)

(52) U.S. Cl.
USPC ........... 524/265; 524/261; 524/264; 524/543; 522/2; 264/400; 264/409; 430/270.1; 430/281.1; 430/286.1; 428/156

(58) Field of Classification Search ............... 430/281.1, 430/270.1, 286.1; 428/156; 522/2; 264/400, 264/409; 524/265, 261, 543, 547
See application file for complete search history.

(56) References Cited

U.S. PATENT DOCUMENTS

| 5,002,857 | A | * | 3/1991 | Toyama et al. ............... 430/300 |
| 7,901,863 | B2 | * | 3/2011 | Yamada et al. ............ 430/270.1 |
| 2006/0257783 | A1 | * | 11/2006 | Sugasaki .................... 430/270.1 |
| 2009/0246469 | A1 | * | 10/2009 | Kawashima et al. ......... 428/156 |
| 2010/0068470 | A1 | * | 3/2010 | Sugasaki ....................... 428/172 |
| 2011/0156317 | A1 | * | 6/2011 | Yoshida ....................... 264/400 |
| 2011/0156318 | A1 | * | 6/2011 | Sugasaki ....................... 264/400 |
| 2011/0159439 | A1 | * | 6/2011 | Kawashima .................. 430/306 |
| 2011/0293897 | A1 | * | 12/2011 | Kawashima ............... 428/195.1 |
| 2011/0311776 | A1 | * | 12/2011 | Sugasaki et al. ............. 428/156 |
| 2012/0145669 | A1 | * | 6/2012 | Tashiro et al. .................. 216/54 |

FOREIGN PATENT DOCUMENTS

| JP | 11-338139 A | 12/1999 |
| JP | 2004-174758 A | 6/2004 |
| JP | 2009-262370 A | 11/2009 |
| WO | 2005/070691 A1 | 8/2005 |

OTHER PUBLICATIONS

Machine Translation of JP 2009/262370.*
"Masterworks Fine Art." http://www.masterworksfineart.com/art/printmaking.php, 2012.*
Machine Translation of Jp 2009/262370, (Nov. 12, 2009).

* cited by examiner

Primary Examiner — Hannah Pak
(74) Attorney, Agent, or Firm — Sughrue Mion, PLLC

(57) ABSTRACT

There are provided a resin composition for laser engraving that can give a relief printing plate having excellent hardness, film elasticity, printing durability, and aqueous ink transfer properties and that has excellent rinsing properties for engraving residue generated when laser-engraving a printing plate and excellent engraving sensitivity in laser engraving, a relief printing plate precursor employing the resin composition for laser engraving, a process for producing a relief printing plate employing the same, and a relief printing plate obtained thereby.

16 Claims, No Drawings

RESIN COMPOSITION FOR LASER ENGRAVING, RELIEF PRINTING PLATE PRECURSOR FOR LASER ENGRAVING, PROCESS FOR PRODUCING RELIEF PRINTING PLATE AND RELIEF PRINTING PLATE

BACKGROUND OF THE INVENTION

1. Technical Field

The present invention relates to a resin composition for laser engraving, a relief printing plate precursor for laser engraving, a process for producing a relief printing plate, and a relief printing plate.

2. Description of the Related Art

Background Art

Conventionally, a hydrophobic laser engraving type printing plate employing natural rubber, synthetic rubber, a thermoplastic elastomer, etc. is used (ref. JP-A-11-338139, etc. (JP-A denotes a Japanese unexamined patent application publication)). As a technique for improving the rinsing properties of engraving residue generated by laser engraving, a technique in which porous inorganic fine particles are contained in a relief-forming layer, and liquid residue is adsorbed on these particles, thus improving removability has been proposed (ref. e.g. JP-A-2004-174758). Moreover, a photosensitive resin composition which contains a binder polymer and a polyfunctional thiol compound and has a non-tacky surface is proposed for laser engraving (JP-A-2009-262370). Furthermore, it has been shown that an organic silicon compound contained in a laser-engravable photosensitive resin composition reduces the percentage residue remaining after engraving (making it difficult for residue to be attached), and engraving residue can easily be wiped away by a cloth impregnated with an organic solvent (International Patent Application WO 2005-070691).

SUMMARY OF THE INVENTION

Problems to be Solved by the Invention

The method described in JP-A-2004-174758 has the problem that, due to particles being contained, an engraved shape (edge shape) is not satisfactory, and degradation of image quality is caused.

Furthermore, the method described in International Patent Application WO 2009-262370 has a problem with the rinsing properties, and in the method described in International Patent Application WO 2005-070691, tacky residue is removed using an organic solvent, and it is difficult to remove tacky residue using an aqueous system, which is excellent in terms of environment suitability.

It is an object of the present invention to provide a resin composition for laser engraving that can give a relief printing plate having excellent hardness, film elasticity, printing durability, and aqueous ink adhering property and that has excellent rinsing properties for engraving residue generated when laser-engraving a printing plate and excellent engraving sensitivity in laser engraving, a relief printing plate precursor employing the resin composition for laser engraving, a process for producing a relief printing plate employing same, and a relief printing plate obtained thereby.

Means for Solving the Problems

The above-mentioned object of the present invention can be achieved by following means of (1), (12), (15) and (16). They are listed with preferable embodiments (2) to (11), (13), (17) and (18).

(1) A resin composition for laser engraving, comprising:
(Component A) a compound having at least two mercapto groups,
(Component B) a compound having at least two ethylenically unsaturated groups,
(Component C) a binder polymer, and
(Component D) a compound having a hydrolyzable silyl group and/or a silanol group, (2) the resin composition for laser engraving according to (1), wherein Component A is a compound denoted by Formula (a):

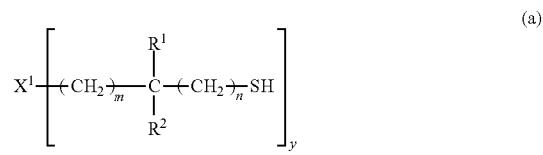

wherein $R^1$ and $R^2$ independently denote a hydrogen atom or an alkyl group having 1 to 10 carbon atoms, m is an integer of 0 to 2, n is 0 or 1, y denotes an integer of 2 or more, and $X^1$ is a γ-valent organic residue, (3) the resin composition for laser engraving according to (1) or (2), wherein Component C is at least one polymer binder selected from the group consisting of acrylic resin and polyvinyl butyral, (4) the resin composition for laser engraving according to any one of (1) to (3), wherein Component C is polyvinyl butyral, (5) the resin composition for laser engraving according to any one of (1) to (4), wherein Component D is a compound having two or more hydrolyzable silyl groups, (6) the resin composition for laser engraving according to any one of (1) to (5), wherein the Component D is a compound having a hydrolyzable silyl group and the hydrolyzable silyl group is a group in which at least one alkoxy group or halogen atom is directly bonded to a Si atom, (7) the resin composition for laser engraving according to (6), wherein the hydrolyzable silyl group is a group in which at least one alkoxy group is directly bonded to a Si atom, (8) the resin composition for laser engraving according to any one of (1) to (7), wherein the composition further comprises (Component E) a crosslinking accelerator, (9) the resin composition for laser engraving according to (8), wherein Component E is one or more accelerator selected from the group consisting of a radical-generating agent, an acid and a base,

(10) the resin composition for laser engraving according to (9), where in Component E is a radical-generating agent,

(11) the resin composition for laser engraving according to any one of (1) to (10), wherein the composition further comprises (Component F) a photothermal conversion agent capable of absorbing light having a wavelength of 700 to 1,300 nm,

(12) a relief printing plate precursor for laser engraving, characterized by being equipped with a relief-forming layer having the resin composition for laser engraving according to any one of (1) to (11) over a support,

(13) the relief printing plate precursor for laser engraving according to (12), wherein the relief-forming layer is a crosslinked relief layer crosslinked by light and/or heat.

(14) The relief printing plate precursor for laser engraving according to (13), wherein the crosslinked relief-forming layer is crosslinked by heat,

(15) a process for producing a relief printing plate, comprising:
an engraving step of laser-engraving the crosslinked relief-forming layer in the relief printing plate precursor according to (13) or (14),
(16) a relief printing plate having a relief layer manufactured by the process for producing a printing plate according to (15),
(17) the relief printing plate according to (16), wherein the thickness of the relief layer is from 0.05 mm to 10 mm,
(18) the relief printing plate according to (16) or (17), wherein the Shore A hardness of the relief layer is from 50° to 90°.

DETAILED DESCRIPTION OF THE INVENTION

Mode for Carrying Out the Invention

The present invention is explained in detail below.

The resin composition for laser engraving of the present invention is characterized by comprising (Component A) a compound having at least two mercapto groups, (Component B) a compound having at least two ethylenically unsaturated groups, (Component C) a binder polymer, and (Component D) a compound having a hydrolyzable silyl group and/or a silanol group.

Another aspect of the present invention is directed to a process for producing a relief printing plate, comprising a layer forming step of a relief-forming layer comprising a resin composition for laser engraving comprising (Component A) a compound having at least two mercapto groups, (Component B) a compound having at least two ethylenically unsaturated groups, (Component C) a binder polymer and (Component D) a compound having a hydrolyzable silyl group and/or a silanol group, a crosslinking step of crosslinking the relief-forming layer by heat and/or light to thus obtain a crosslinked relief-forming layer; and an engraving step of laser-engraving the crosslinked relief-forming layer to form a relief layer.

The resin composition for laser engraving and the process for producing a relief printing plate described above have common embodiments. Therefore, for convenience, the resin composition for laser engraving is explained below.

Firstly, Components A to D are explained below.

(Component A) a Compound Comprising at Least Two Mercapto Groups in a Molecule

Component A for use in the present invention may be any of polyfunctional thiol compounds, and no particular limitation is imposed on it, but, as the group comprising a mercapto group, a mercapto group-containing group denoted by Formula (a) below is preferable.

Hereinafter, Component A is also referred to as a "polyfunctional thiol compound."

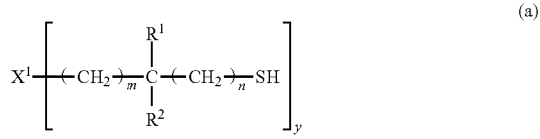

(a)

wherein $R^1$ and $R^2$ independently denote a hydrogen atom or an alkyl group having 1 to 10 carbon atoms, m is an integer of 0 to 2, n is 0 or 1, y denotes an integer of 2 or more, and $X^1$ is a γ-valent organic residue.

$R^1$ is preferably a hydrogen atom or an alkyl group having 1 to 10 carbon atoms, and $R^2$ is preferably a hydrogen atom.

As shown by Formula (a), in the polyfunctional thiol compound for use in the present invention, a mercapto group-containing group may be bonded to the organic residue $X^1$ in any form, but, as shown in Formula (b) below, the mercapto-containing group is preferably bonded to the organic residue via a carboxylic acid ester residue.

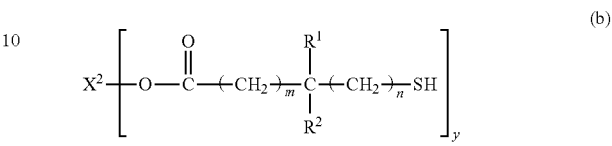

(b)

wherein $R^1$ and $R^2$ independently denote a hydrogen atom or an alkyl group having 1 to 10 carbon atoms, m is an integer of 0 to 2, n is 0 or 1, y denotes an integer of 2 or more, and $X^2$ is a γ-valent organic residue.

$R^1$ is preferably a hydrogen atom or an alkyl group having 1 to 10 carbon atoms, and $R^2$ is preferably a hydrogen atom.

In Formula (b), n is preferably 0, and m is preferably 0 or 1, and more preferably 1.

That is, the mercapto group is preferably a primary or secondary mercapto group, and more preferably a primary mercapto group. Furthermore, the polyfunctional thiol compound has more preferably three or more mercapto group-containing groups (y is an integer of 3 or more), instead of 2 (y=2). Meanwhile, all of the plural mercapto group-containing groups present in a molecule may be the same, or different each other.

In Formulae (a) or (b), the alkyl group denoted by $R^1$ or $R^2$ has preferably 1 to 5 carbon atoms, more preferably 1 to 3, and is particularly preferably a methyl group.

As the organic residue (mother nucleus) $X^1$ or $X^2$ in the polyfunctional thiol compound for use in the present invention, such group can be exemplified as an aliphatic group, an aromatic group or heterocyclic group, and a group obtained by combining these, and each may have a substituent. Moreover, the aliphatic group, the aromatic group or heterocyclic group may be bonded directly, or via a divalent linking group selected from the group consisting of —O—, —S—, —CO—, —NH—, —SO$_2$—, —SO— and the combination thereof.

The chemical structure of the organic residue (mother nucleus) is explained in detail below.

The number of carbons of the aliphatic group is preferably from 1 to 60, more preferably from 1 to 30, yet more preferably from 1 to 20, and most preferably from 1 to 10. The aliphatic group may have a double bond or triple bond. The aliphatic group may have a ring-shaped structure or a branch.

The aromatic group is constituted preferably of a benzene ring or a naphthalene ring, and more preferably of a benzene ring.

The heterocyclic group has preferably a 3- to 10-membered heterocyclic ring, more preferably a 4- to 8-membered heterocyclic ring, and most preferably a 5- or 6-membered heterocyclic ring. The hetero atom of the heterocyclic ring is preferably a nitrogen atom, an oxygen atom or a sulfur atom. To the heterocyclic ring, an aliphatic ring, an aromatic ring or another heterocyclic ring may be condensed or bonded through a spiro bond. Examples of the heterocyclic rings include a pyrrolidine ring, a piperidine ring, a piperazine ring, a morpholine ring, a tetrahydrofuran ring, a tetrahydropyran ring, a tetrahydrothiophene ring, a dioxane ring, an oxazole ring, a thiazole ring, a pyridine ring, a pyrazine ring, a triazine ring, a furan ring, a thiophene ring and an isocyanuric ring. Of these, the isocyanuric ring is most preferable.

Examples of the substituents of the aliphatic group, the aromatic group and the heterocyclic group include a hydroxyl group, a halogen atom (for example, chlorine atom), a cyano group, an amino group, a substituted amino group, a heterocyclic group, an acyl group and an acyloxy group. The substituent of the substituted amino group is preferably an alkyl group or an aryl group. The aromatic group and the heterocyclic group may have an alkyl group as a substituent.

In addition, the aforementioned substituents do not include a mercapto group or a group containing the same.

Preferable specific examples of $X^1$ or $X^2$, which is a mother nucleus of the polyfunctional thiol compound, are shown below, but the present invention is not limited to these. Meanwhile, the position at which a mercapto-containing group (including a mercapto-containing group via a carboxylic acid ester as shown by Formula (b)) is bonded to the mother nucleus is shown by *.

The organic residue of the Component A can include a structural unit obtained by addition polymerization or polycondensation, including, for example, an oligovinyl group or a polyvinyl group. The Component A is preferably a low molecular weight compound having a molecular weight of 10,000 or less. It is explained in detail later.

Specific examples of the polyfunctional thiol compounds for use in the invention are listed below, but they are not limited to these.

There are compounds having two mercapto groups such as 1,2-ethanedithiol, 1,3-propanedithiol, 1,4-butanedithiol, 2,3-butanedithiol, 1,5-pentanedithiol, 1,6-hexanedithiol, 1,8-octanedithiol, 1,9-nonanedithiol, 2,3-dimercapto-1-propanol, dithioerythritol, 2,3-dimercaptosuccinic acid, 1,2-benzenedithiol, 1,2-benzenedimethanethiol, 1,3-benzenedithiol, 1,3-benzenedimethanethiol, 1,4-benzenedimethanethiol, 3,4-dimercaptotoluene, 4-chloro-1,3-benzenedithiol, 2,4,6-trimethyl-1,3-benzenedimethanethiol, 4,4'-thiodiphenol,

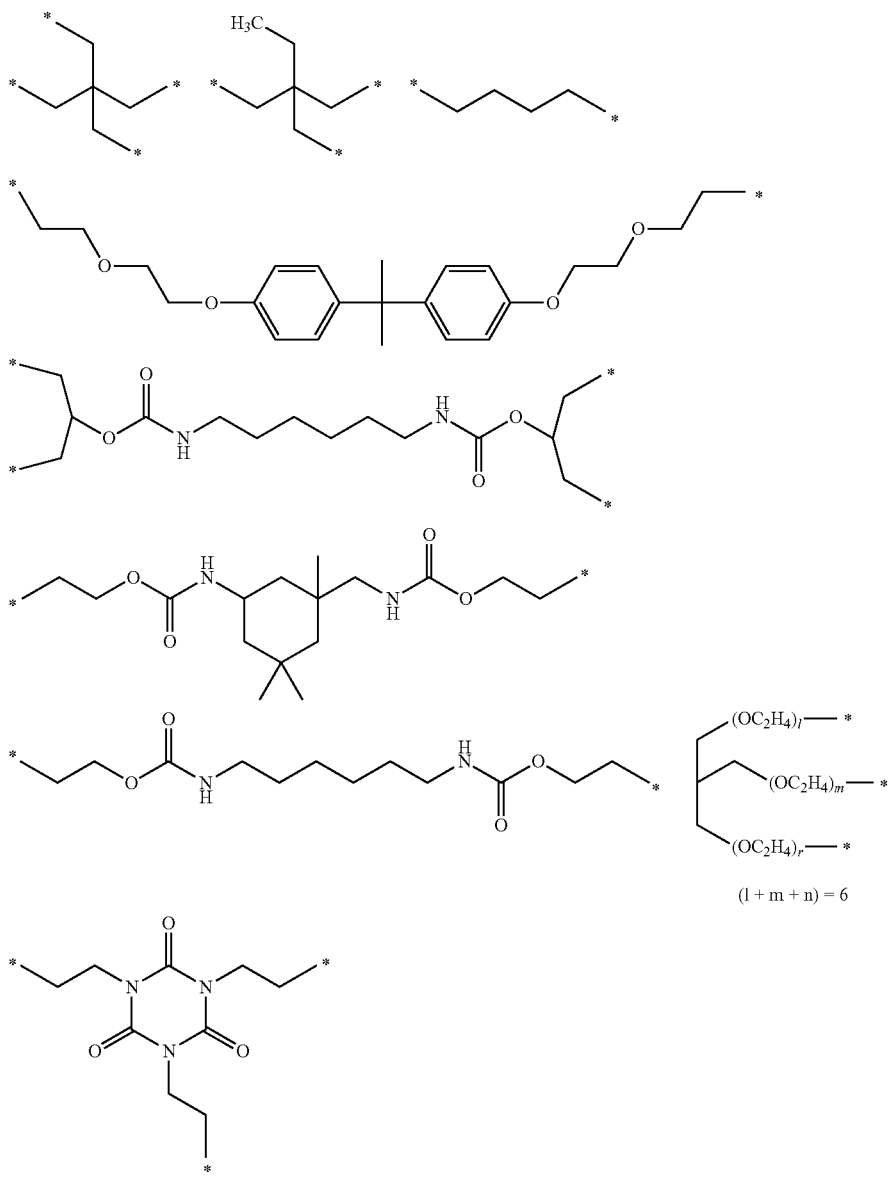

2-hexylamino-4,6-dimercapto-1,3,5-triazine, 2-diethylamino-4,6-dimercapto-1,3,5-triazine, 2-cyclohexylamino-4,6-dimercapto-1,3,5-triazine, 2-di-n-butylamino-4,6-dimercapto-1,3,5-triazine, ethylene glycol bis(3-mercaptopropionate), butanediol bisthioglycolate, ethylene glycol bisthioglycolate, 2,5-dimercapto-1,3,4-thiadiazol, 2,2'-(ethylenedithio)diethanethiol and 2,2-bis(2-hydroxy-3-mercaptopropoxyphenylpropane), compounds having three mercapto groups such as 1,2,6-hexanetriol trithilglycolate, 1,3,5-trithiocyanuric acid, trimethylolpropane tris(3-mercaptopropionate) and trimethylolpropane tristhioglycolate, and compounds having four or more mercapto groups such as pentaerythritol tetrakis(3-mercaptopropionate) and pentaerythritol tetrakis thioglycolate. As commercially available products of these polyfunctional thiol compounds, there are ethylene glycol bisthiopropionate, trimethylolpropane tristhiopropionate and pentaerythritol tetrakis thiopropionate (all are manufactured by YODO KAGAKU CO., LTD.) etc.

In addition to compounds exemplified above, compounds described in JP-A-2009-262370, paragraphs 0033 to 0035 can be used in the invention.

These compounds include bifunctional thiol compounds such as 1,2-benzenedimethanethiol, o-, m- or p-xylene dithiol, ethylene glycol bisthiopropionate, butanediol bisthiopropionate, hexanediol bisthioglycolate, 1,4-bis(3-mercaptobutyryloxy)butane, 2-(dimethylamino)-1,3-propanebisthiol, 1,3-dimercapto-2-propanol, 2,3-dimercapto-1-propanol and 2,5-diamino-1,4-benzenedithiol, trifunctional thiol compounds having three or more polymerizable functional groups such as 1,3,5-tris(3-mercaptobutyloxyethyl)-1,3,5-triazine-2,4,6-trimethylolpropane tristhiopropionate, trihydroxyethyltriisocyanuric acid tristhiopropionate and tris-[(ethyl-3-mercaptopropionyloxy)-ethyl]isocyanulate, tetrafunctional thiol compounds such as pentaerythritol tetrakis(3-mercaptobutyrate) and dipentaerythritol hexakis-3-mercaptopropionate, etc.

Commercial products of these polyfunctional thiol compounds include 1,4-bis(3-mercaptobutyryloxy)butane (Karenz MT BD1) (trade name), pentaerythritol tetrakis(3-mercaptobutyrate) (Karenz MT PE1) (trade name), 1,3,5-tris (3-mercaptobutyloxyethyl)-1,3,5-triazine-2,4,6(1H,3H,5H)-trione (Karenz MT NR1) (trade name) (all supplied by SHOWA DENKO K. K.), trimethylolpropane-tris-3-mercaptopropionate (TMMP) (trade name), pentaerythritol tetrakis-3-mercaptobutyrate (PEMP) (trade name), dipentaerythritol hexakis-3-mercaptopropionate (DPMP) (trade name), and tris-([ethyl-3-mercaptopropionyloxy)-ethyl]isocyanulate (TEMPIC) (trade name) (all supplied by SAKAI CHEMICAL INDUSTRY CO., LTD.).

Among above-mentioned polyfunctional thiol compounds, those having many mercapto groups in a molecule have a high effect of improving the sensitivity by addition in a small amount, and, therefore, polyfunctional thiol compounds having three or more mercapto groups in a molecule are preferable.

Moreover, polyfunctional thiol compounds having a carboxylic acid ester bond are preferable. As the polyfunctional thiol compound having the ester bond, esters of thioglycolic acid or 3-mercaptopropionic acid with polyhydric alcohol are preferable.

Examples of preferable specific compounds include trimethylolpropane tris(3-mercaptopropionate) (A-2), pentaerythritol tetrakis(3-mercaptopropionate) (A-8), and 1,3,5-tris(3-mercaptobutyryloxyethyl)-1,3,5-triazine-2,4,6(1H,3H,5H)-trione.

Including two compounds described above, preferable specific examples are shown below by chemical formulae. Some of the compounds were used in Examples.

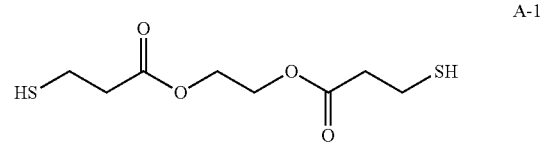

A-1

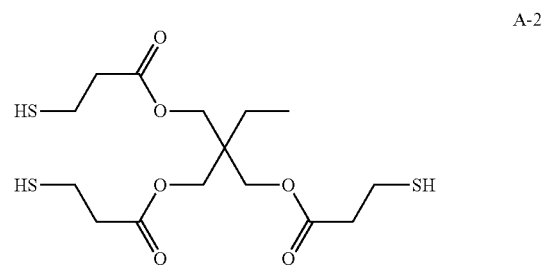

A-2

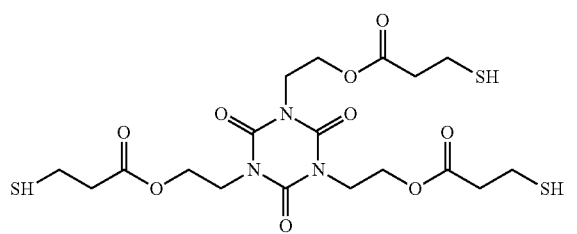

A-3

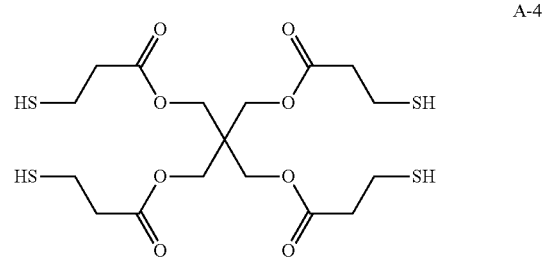

A-4

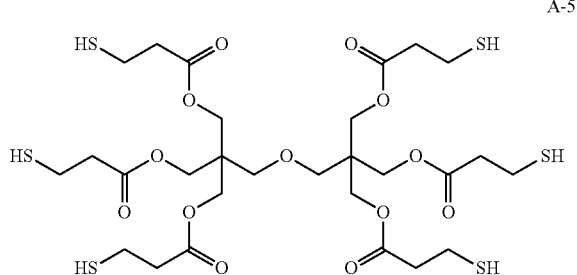

A-5

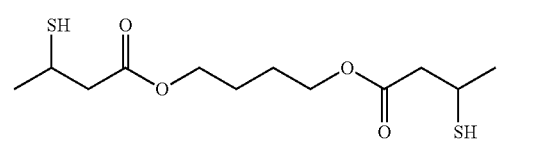

A-6

-continued

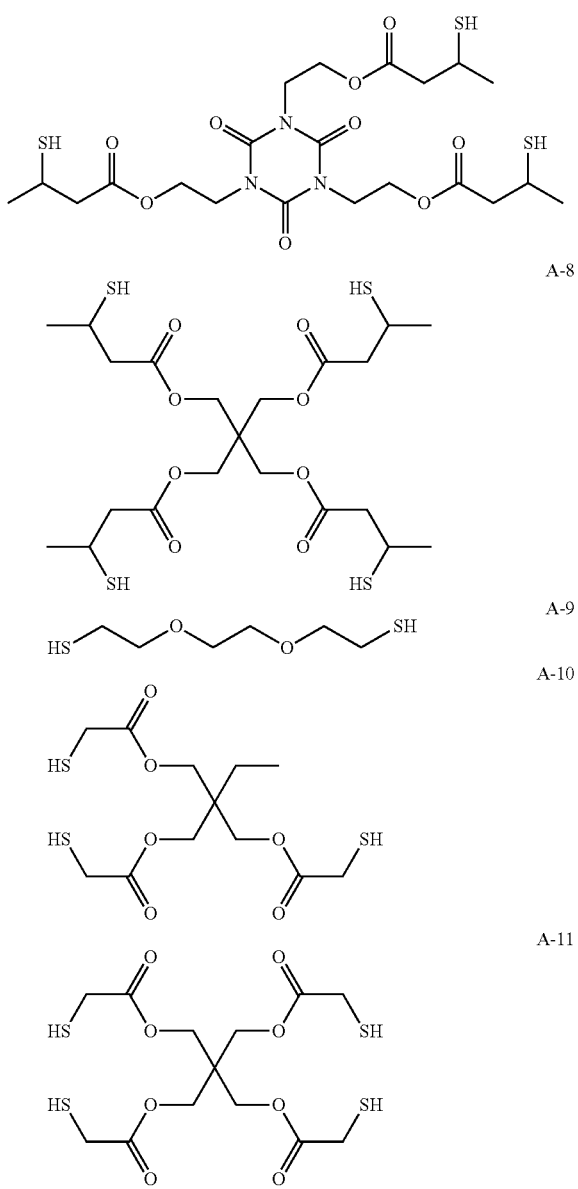

The molecular weight of the Component A (polyfunctional thiol compound) for use in the present invention is not particularly limited, but is preferably 100 to 10,000, more preferably 200 to 5,000, and particularly preferably 200 to 1,000. A molecular weight in this range results in an excellent volatility, odor, solubility or compatibility.

The content of the polyfunctional thiol compound in the resin composition of the present invention is, relative to the total nonvolatile content of the resin composition, preferably 0.1 to 20 wt %, and more preferably 0.5 to 15 wt %. These polyfunctional thiol compounds may be used singly or in combination of two or more kinds.

(Component B) A Compound Having at Least Two Ethylenically Unsaturated Groups

Hereinafter, Component B is also referred to as a "polyfunctional ethylenically unsaturated compound."

As the polyfunctional ethylenically unsaturated compound, compounds having 2 to 20 terminal ethylenically unsaturated groups are preferable. These compound groups are widely known in the present industrial field, and, in the present invention, these may be used without particular limitation. These have chemical forms such as a monomer, a prepolymer, that is, a dimer, a trimer and an oligomer, or copolymers of monomers, and mixtures thereof.

Examples of compounds from which the ethylenically unsaturated group in the polyfunctional ethylenically unsaturated compound is derived include unsaturated carboxylic acids (such as acrylic acid, methacrylic acid, itaconic acid, crotonic acid, isocrotonic acid and maleic acid), and esters and amides thereof. Preferably esters of an unsaturated carboxylic acid and an aliphatic polyhydric alcoholic compound, or amides of an unsaturated carboxylic acid and an aliphatic polyvalent amine compound are used. Moreover, addition reaction products of unsaturated carboxylic acid esters or amides having a nucleophilic substituent such as a hydroxyl group or an amino group with polyfunctional isocyanates or epoxies, and dehydrating condensation reaction products with a polyfunctional carboxylic acid, etc. are also used favorably. Moreover, addition reaction products of unsaturated carboxylic acid esters or amides having an electrophilic substituent such as an isocyanato group or an epoxy group with monofunctional or polyfunctional alcohols or amines, and substitution reaction products of unsaturated carboxylic acid esters or amides having a leaving group such as a halogen group or a tosyloxy group with monofunctional or polyfunctional alcohols or amines are also favorable. Moreover, as another example, the use of compounds obtained by replacing the unsaturated carboxylic acid with a vinyl compound, an allyl compound, an unsaturated phosphonic acid, styrene or the like is also possible.

From the viewpoint of the reactivity, the ethylenically unsaturated group contained in the polyfunctional ethylenically unsaturated compound is preferably a residue of each of acrylates, methacrylates, vinyl compounds and allyl compounds. From the viewpoint of the printing durability, the polyfunctional ethylenically unsaturated compound more preferably comprises three or more ethylenically unsaturated groups.

Specific examples of ester monomers of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, a polyester acrylate oligomer, and an ethylene oxide (EO)-modified isocyanurate triacrylate.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetrad icrotonate.

Examples of isocrotonic acid esters include ethylene glycol diisocrotonate, pentaerythritol diisocrotonate, and sorbitol tetraisocrotonate.

Examples of maleic acid esters include ethylene glycol dimaleate, triethylene glycol dimaleate, pentaerythritol dimaleate, and sorbitol tetramaleate.

As examples of other esters, aliphatic alcohol-based esters described in JP-B-46-27926, JP-B-51-47334 (JP-B denotes a Japanese examined patent application publication) and JP-A-57-196231, those having an aromatic skeleton described in JP-A-59-5240, JP-A-59-5241, and JP-A-2-226149, those having an amino group described in JP-A-1-165613, etc. may also be used suitably.

The above-mentioned ester monomers may be used as a mixture.

Furthermore, specific examples of amide monomers of an aliphatic polyamine compound and an unsaturated carboxylic acid include N,N'-methylenebisacrylamide, N,N'-methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Preferred examples of other amide-based monomers include those having a cyclohexylene structure described in JP-B-54-21726.

Furthermore, a urethane-based addition-polymerizable compound produced by an addition reaction of an isocyanate and a hydroxy group is also suitable, and specific examples thereof include a vinylurethane compound comprising two or more polymerizable vinyl groups per molecule in which a hydroxy group-containing vinyl monomer represented by Formula (i) below is added to a polyisocyanate compound having two or more isocyanate groups per molecule described in JP-B-48-41708.

$$CH_2=C(R)COOCH_2CH(R')OH \qquad (i)$$

wherein R and R' independently denote H or $CH_3$.

Furthermore, urethane acrylates described in JP-A-51-37193, JP-B-2-32293, and JP-B-2-16765, and urethane compounds having an ethylene oxide-based skeleton described in JP-B-58-49860, JP-B-56-17654, JP-B-62-39417, JP-B-62-39418 are also suitable.

Furthermore, by use of an addition-polymerizable compound having an amino structure or a sulfide structure in the molecule described in JP-A-63-277653, JP-A-63-260909, and JP-A-1-105238, a photosensitive resin composition having very good photosensitive speed can be obtained.

Other examples include polyester acrylates such as those described in JP-A-48-64183, JP-B-49-43191, and JP-B-52-30490, and polyfunctional acrylates and methacrylates such as epoxy acrylates formed by a reaction of an epoxy resin and (meth)acrylic acid. Examples also include specific unsaturated compounds described in JP-B-46-43946, JP-B-1-40337, and JP-B-1-40336, and vinylphosphonic acid-based compounds described in JP-A-2-25493. In some cases, perfluoroalkyl group-containing structures described in JP-A-61-22048 are suitably used. Moreover, those described as photocuring monomers or oligomers in the Journal of the Adhesion Society of Japan, Vol. 20, No. 7, pp. 300 to 308 (1984) may also be used.

Examples of the vinyl compounds include butanediol-1,4-divinyl ether, ethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane tirvinyl ether, trimethylolethane tirvinyl ether, hexanediol divinyl ether, tetraethylene glycol divinyl ether, pentaerythritol divinyl ether, pentaerythritol tirvinyl ether, pentaerythritol tetravinyl ether, sorbitol tetravinyl ether, sorbitol pentavinyl ether, ethylene glycol diethylenevinyl ether, ethylene glycol dipropylenevinyl ether, trimethylolpropane triethylenevinyl ether, trimethylolpropane diethylenevinyl ether, pentaerythritol diethylenevinyl ether, pentaerythritol triethylenevinyl ether, pentaerythritol tetraethylenevinyl ether, 1,1,1-tris[4-(2-vinyloxyethoxy)phenyl]ethane, bisphenol A divinyloxyethyl ether, divinyl adipate, etc.

Examples of the allyl compounds include polyethylene glycol diallyl ether, 1,4-cyclohexane diallyl ether, 1,4-diethylcyclohexyl diallyl ether, 1,8-octane diallyl ether, trimethylolpropane diallyl ether, trimethylolethane triallyl ether, pentaerythritol triallyl ether, pentaerythritol tetraallyl ether, dipentaerythritol pentaallyl ether, dipentaerythritol hexaallyl ether, diallyl phthalate, diallyl terephthalate, diallyl isophthalate, triallyl isocyanurate, triallyl phosphate, etc.

Preferable specific examples of Component B usable for the resin composition and the relief printing plate precursor of the present invention are exemplified below, but are not limited to these.

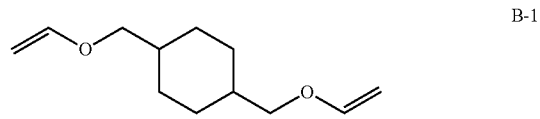

B-1

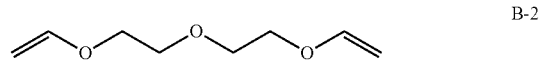

B-2

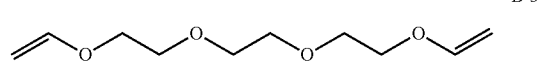

B-3

B-4

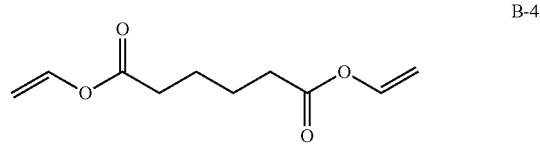

B-5

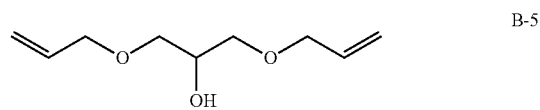

B-6

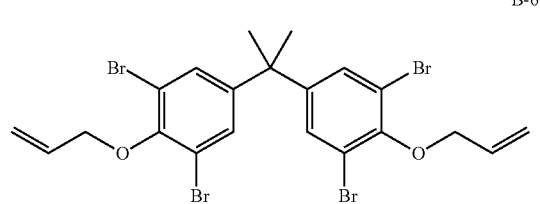

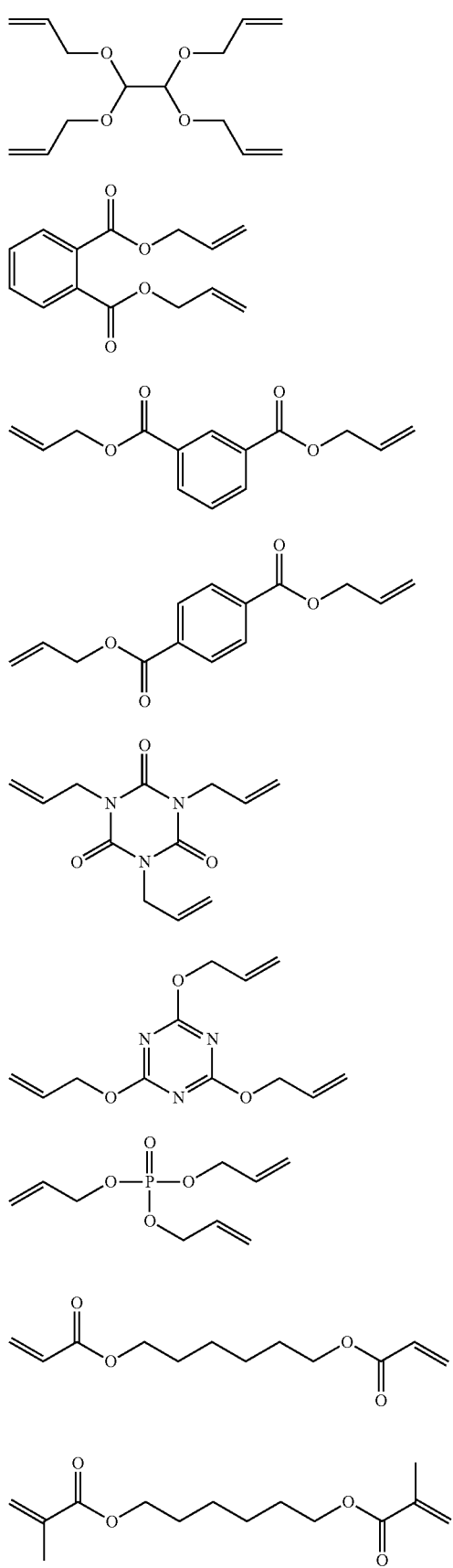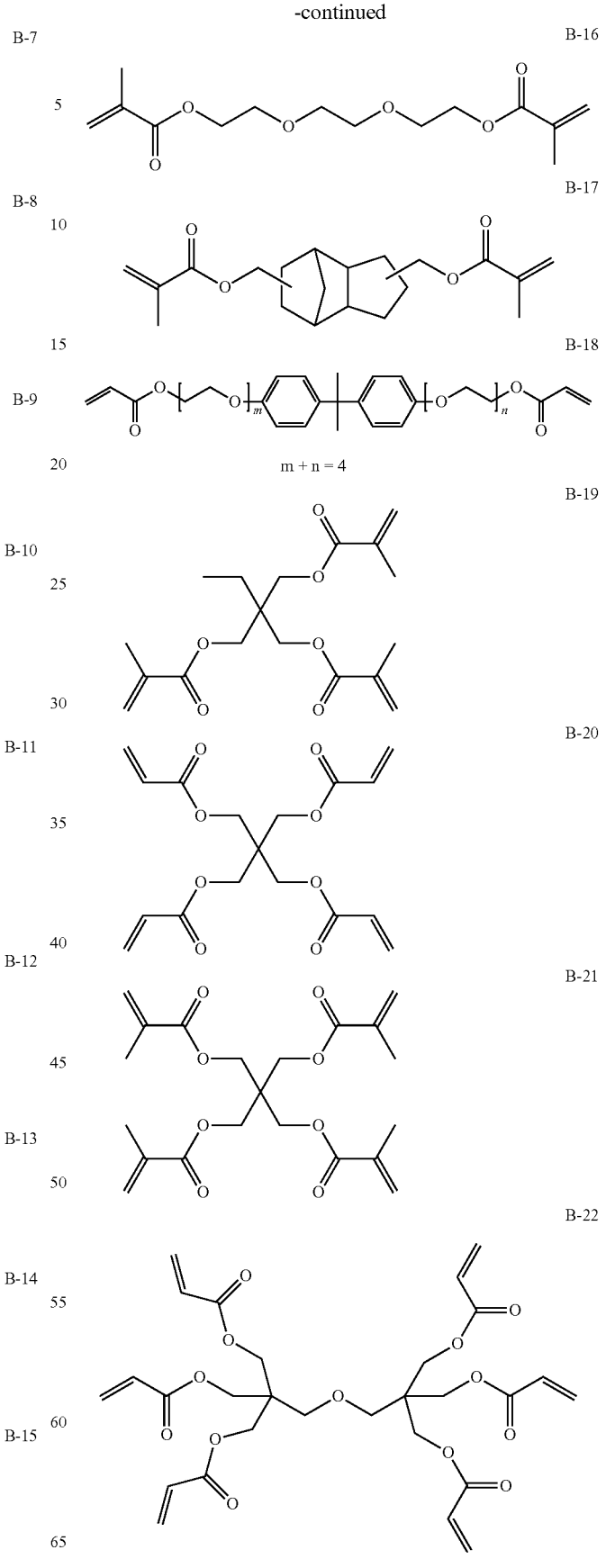

In the resin composition of the present invention, the sum of the functional number (y) of the mercapto group in Component A and the number of the ethylenically unsaturated group in Component B is preferably 5 or more, more preferably 6 or more, and particularly preferably 6 to 10. The sum falling within the range can give an appropriate degree of crosslinking, to thereby form a resin composition that gives a relief-forming layer excellent in mechanical strength.

Relative to the total ethylenically unsaturated compound in the resin composition that gives the relief-forming layer, the polyfunctional ethylenically unsaturated compound in Component B is used preferably by 90 wt % or more, and more preferably by 95 wt % or more. That is, relative to the total ethylenically unsaturated compound in the resin composition that gives the relief-forming layer, the monofunctional ethylenically unsaturated compound is used preferably only in less than 10 wt %, more preferably only in less than 5 wt %, and particularly preferably none.

In the total nonvolatile component of the resin composition, the content of Component B is preferably 5 to 20 wt %, and more preferably 7 to 15 wt %.

In the resin composition for laser engraving or the process for producing a relief printing plate according to the present invention, Component A and Component B are crosslinked by an ene-thiol reaction. Consequently, it is appropriate to formulate Component A and Component B so that the ethylenically unsaturated bond and the thiol group give an approximately equivalent molar ratio. The molar ratio of Component A/Component B is preferably about 1/30 to 2/1, and more preferably 1/10 to 1/1.

(Component C) a Binder Polymer

The resin composition for laser engraving of the present invention comprises (Component C) a binder polymer.

The binder polymer is a polymeric component contained in the resin composition for laser engraving, and a general polymer compound may be selected appropriately and used singly or in combination of two or more types. In particular, when the resin composition for laser engraving is to be used as a printing plate precursor, preferably the selection is performed while considering various performances such as laser engraving properties, ink-adhering properties, and dispersion properties of engraving residue.

The binder polymer may be selected and used from polystyrene resin, polyester resin, polyamide resin, polysulfone resin, polyethersulfone resin, polyimide resin, hydrophilic polymer comprising a hydroxyethylene unit, acrylic resin, acetal resin, epoxy resin, polycarbonate resin, rubber, thermoplastic elastomer, etc.

For example, from the viewpoint of laser engraving sensitivity, a polymer comprising a partial structure that is thermally decomposed by exposure or heating is preferable. As such polymer, those described in JP-A-2008-163081, paragraph 0038 are preferably cited. Moreover, when a purpose is to form a film that has softness and flexibility, a soft resin or a thermoplastic elastomer is selected. There is detailed description in JP-A-2008-163081, paragraphs 0039 to 0040. Furthermore, in the case where the resin composition for laser engraving is applied to the relief-forming layer in the relief printing plate precursor for laser engraving, from the viewpoint of easiness of preparing a composition for the relief-forming layer and improvement of resistance properties for an oil-based ink in the relief printing plate to be obtained, the use of a hydrophilic or alcoholphilic polymer is preferable. As the hydrophilic polymer, those described in detail in JP-A-2008-163081, paragraph 0041 can be used.

In addition, when it is used for the purpose of curing by heating or light-exposure to improve the strength, polymers having an ethylenically unsaturated bond in the molecule are preferably used.

As such polymers, examples of polymers comprising an ethylenically unsaturated bond in a main chain include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), etc.

Polymers having an ethylenically unsaturated bond in a side chain are obtained by introducing an ethylenically unsaturated bond such as an allyl group, an acryloyl group, a methacryloyl group, a styryl group, a vinyl ether group or the like into the side chain of the skeleton of a binder polymer described later. As the method for introducing an ethylenically unsaturated bond into the side chain of the binder polymer, known methods may be employed, such as (1) a method in which a structural unit having a polymerizable group precursor formed by linking a protective group to a polymerizable group is copolymerized with a polymer, and the protective group is removed to form the polymerizable group, (2) a method in which a polymeric compound having plural reactive groups such as a hydroxyl group, an amino group, an epoxy group, a carboxylic group or the like is produced, and a compound having a group reacting with these reactive groups and an ethylenically unsaturated bond is introduced by a polymer reaction, etc. According to these methods, the amount of an ethylenically unsaturated group to be introduced into the polymer compound can be controlled.

(Component C) A binder polymer is preferably a binder polymer having a functional group capable of reacting with a hydrolyzable silyl group and/or a silanol group in (Component D) a compound having a hydrolyzable silyl group and/or a silanol group to be described in detail below, (hereinafter, the functional group is suitably referred to as a "reactive functional group").

No particular limitation is imposed on the reactive functional group contained in Component C, only if it is a group capable of reacting with a hydrolyzable silyl group and/or a silanol group in Component D to form a —Si—O— bond, but a hydroxyl group, a silanol group and a hydrolyzable silyl group are preferable.

The reactive functional group may be present in any part of the polymer molecule, but preferably lies on the side chain of the chain polymer. Preferable examples of such polymers include vinyl copolymers (copolymers of vinyl monomers such as polyvinyl alcohol and polyvinyl acetal, and derivatives thereof) and acrylic resins (copolymers of acrylic monomers such as hydroxyethyl(meth)acrylate, and derivatives thereof).

The method for introducing the reactive functional group into the binder polymer is not particularly limited, and includes a method of addition (co)polymerizing or polycondensing a monomer having the reactive functional group, and a method of synthesizing a polymer having a group inducible to the reactive functional group and inducing the polymer to the reactive functional group by a polymer reaction.

As the polymer of Component C, in particular, (C-1) a binder polymer having a hydroxyl group is preferably used. It is explained below.

(C-1) Binder Polymer Having a Hydroxyl Group

Hereinafter, as the binder polymer of Component C in the resin composition of the present invention, (C-1) a binder polymer having a hydroxyl group (hereinafter, if necessary, also referred to as "Component C-1" or a "specific polymer")

is preferable. The specific polymer is preferably insoluble in water and soluble in alcohol having 1 to 4 carbon atoms.

As Component C-1 for the resin composition for laser engraving that gives a relief-forming layer satisfying both good durability properties for an aqueous ink and for a UV ink, and having a high engraving sensitivity and good film performance, polyvinyl acetal and derivatives thereof, acrylic resins having a hydroxyl group on a side chain, epoxy resins having a hydroxyl group on a side chain, etc. are preferably cited.

For improvement of engraving sensitivity, Component C-1 preferably has a glass transition temperature (Tg) of at least 20° C., and it is particularly preferable that it has a glass transition temperature (Tg) of at least 20° C. when combined with (Component F) a photothermal conversion agent capable of absorbing light having a wavelength of 700 to 1,300 nm, an optional component (hereinafter, suitably referred to as "Component F" or "Photothermal conversion agent"). A polymer having a glass transition temperature of at least 20° C. is also called a 'non-elastomer' below. The upper limit for the glass transition temperature of the polymer is not limited, but is preferably no greater than 200° C. from the viewpoint of ease of handling, and is more preferably at least 25° C. but no greater than 120° C.

When a polymer having a glass transition temperature of 20° C. (room temperature) or greater is used, a specific polymer is in a glass state at normal temperature. Because of this, compared with a case of the rubber state, thermal molecular motion is suppressed. In laser engraving, in addition to the heat given by a laser during laser irradiation, heat generated by the function of (Component F) a photothermal conversion agent added as desired is transmitted to the surrounding specific polymer, and this polymer is thermally decomposed and disappears, thereby forming an engraved recess.

When a specific polymer is used, it is surmised that when a photothermal conversion agent is present in a state in which thermal molecular motion of a specific polymer is suppressed, heat transfer to and thermal decomposition of the specific polymer occur effectively. It is anticipated that such an effect further increases the engraving sensitivity.

Specific examples of polymers that are non-elastomer for use preferably in the present invention are cited below.

(1) Polyvinyl Acetal and its Derivative

Polyvinyl acetal is a compound obtained by converting polyvinyl alcohol (obtained by saponifying polyvinyl acetate) into a cyclic acetal. The polyvinyl acetal derivative is a derivative obtained by modifying the polyvinyl acetal or adding another copolymer constituent.

The acetal content in the polyvinyl acetal derivative (mole % of vinyl alcohol units converted into acetal relative to the total number of moles of vinyl acetate monomer starting material as 100 mole %) is preferably 30 to 90 mole %, more preferably 50 to 85 mole %, and particularly preferably 55 to 78 mole %.

The vinyl alcohol unit in the polyvinyl acetal is preferably 10 to 70 mole % relative to the total number of moles of the vinyl acetate monomer starting material, more preferably 15 to 50 mole %, and particularly preferably 22 to 45 mole %.

Furthermore, the polyvinyl acetal may have a vinyl acetate unit as another component, and the content thereof is preferably 0.01 to 20 mole %, and more preferably 0.1 to 10 mole %. The polyvinyl acetal derivative may further have another copolymerized constitutional unit.

Examples of the polyvinyl acetal include polyvinyl butyral, polyvinyl propylal, polyvinyl ethylal, and polyvinyl methylal. Among them, polyvinyl butyral derivative (PVB) is a derivative that is particularly preferably used.

Polyvinyl butyral is conventionally obtained by converting polyvinyl alcohol into polyvinyl bytyral. Polyvinyl butyral derivatives may be also used.

Examples of the polyvinyl butyral derivatives include an acid-modified PVB in which at least some of the hydroxy groups of the hydroxyethylene units are modified with an acid group such as a carboxy group, a modified PVB in which some of the hydroxy groups are modified with a (meth)acryloyl group, a modified PVB in which at least some of the hydroxy groups are modified with an amino group, a modified PVB in which at least some of the hydroxy groups have introduced thereinto ethylene glycol, propylene glycol, or a multimer thereof.

From the viewpoint of a balance being achieved between engraving sensitivity and film formation properties, the weight-average molecular weight of the polyvinyl acetal is preferably 5,000 to 800,000, more preferably 8,000 to 500,000 and, from the viewpoint of improvement of rinsing properties for engraving residue, particularly preferably 50,000 to 300,000.

Hereinafter, polyvinyl butyral (PVB) and derivatives thereof are cited for explanation as particularly preferable examples of polyvinyl acetal, but the acetal are not limited to these.

Polyvinyl butyral has a structure as shown below, and is constituted while including these structural units.

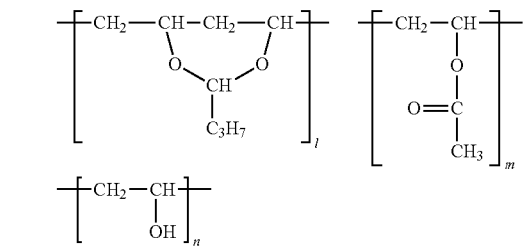

wherein l, m, and n denote the content (mol %) in polyvinyl butyral of the respective repeating units and the relationship l+m+n=100 is satisfied.

The butyral content in the polyvinyl butyral and the derivative thereof (value of l in the formula above) is preferably 30 to 90 mole %, more preferably 40 to 85 mole %, and particularly preferably 45 to 78 mole %.

From the viewpoint of a balance being achieved between engraving sensitivity and film formation properties, the weight-average molecular weight of the polyvinyl butyral and the derivative thereof is preferably 5,000 to 800,000, more preferably 8,000 to 500,000 and, from the viewpoint of improvement of rinsing properties for engraving residue, particularly preferably 50,000 to 300,000.

Polyvinyl butyral derivatives are commercially available and preferable examples from viewpoint of solubility in alcohol, particularly in ethanol, are the 'E-LEC B' series and the 'E-LEC K (KS)' series manufactured by Sekisui Chemical co., Ltd., the Denka Butyral series manufactured by Denki Kagaku Kogyo Kabushiki Kaisha. From the viewpoint of alcohol solubility (particularly in ethanol), the polyvinyl butyral is preferably the 'S-LEC B' series and the 'S-LEC K(KS)' series manufactured by Sekisui Chemical Co., Ltd. From the viewpoint of alcohol solubility (particularly in ethanol), the 'S-LEC B' series manufactured by Sekisui Chemical Co., Ltd. and 'Denka Butyral' manufactured by Denki Kagaku Kogyo Kabushiki Kaisha are more preferable; among the '5-LEC B' series, 'BL-1', 'BL-1H', 'BL-2', 'BL- 5', 'BX-L', 'BM-S', and 'BH-S' are particularly preferable, and among the 'Denka Butyral' manufactured by Denki Kagaku Kogyo Kabushiki Kaisha '#3000-1', '#3000-2', '#3000-4', '#4000-2', '#6000-C', '#6000-EP', '#6000-CS', and '#61300-AS' are particularly preferable.

When manufacturing a relief-forming layer from PVB as a special polymer, casting and drying of a solution in a solvent is preferable from viewpoint of flatness of the film surface.

(2) An Acrylic Resin

As an acrylic resin usable as a special polymer an acrylic resin may be used which can be synthesized from an acrylic monomer having a hydroxy group in the monomer. Preferable examples of the acrylic monomer having a hydroxy group are a (meth)acrylic acid ester, a crotonic acid ester, or a (meth)acrylamide that has a hydroxy group in the molecule. Specific examples of such a monomer include 2-hydroxyethyl(meth)acrylate, 2-hydroxypropyl(meth)acrylate, and 4-hydroxybutyl(meth)acrylate.

In the present invention '(meth)acryl' means 'acryl' and/or 'methacryl' and '(meth)acrylate' means 'acrylate' and/or 'methacrylate.'

The acrylic resin may be constituted from a known acrylic comonomer other than the acrylic monomer having a hydroxy group explained above.

As the known (meth)acrylic comonomer, the (meth)acrylic monomer can be cited, and specific examples thereof include methyl(meth)acrylate, ethyl(meth)acrylate, n-propyl(meth)acrylate, isopropyl(meth)acrylate, n-butyl(meth)acrylate, isobutyl(meth)acrylate, tert-butyl(meth)acrylate, n-hexyl(meth)acrylate, lauryl(meth)acrylate, 2-ethylhexyl(meth)acrylate, acetoxyethyl(meth)acrylate, phenyl(meth)acrylate, 2-methoxyethyl(meth)acrylate, 2-ethoxyethyl(meth)acrylate, 2-(2-methoxyethoxy)ethyl(meth)acrylate, cyclohexyl(meth)acrylate, t-butylcyclohexyl(meth)acrylate benzyl(meth)acrylate, diethylene glycol monomethyl ether(meth)acrylate, diethylene glycol monoethyl ether(meth)acrylate, diethylene glycol monophenyl ether (meth)acrylate, triethylene glycol monomethyl ether(meth)acrylate, triethylene glycol monoethyl ether(meth)acrylate, dipropylene glycol monomethyl ether (meth)acrylate, polyethylene glycol monomethyl ether(meth)acrylate, polypropylene glycol monomethyl ether(meth)acrylate, the monomethyl ether (meth)acrylate of a copolymer of ethylene glycol and propylene glycol, N,N-dimethylaminoethyl(meth)acrylate, N,N-diethylaminoethyl(meth)acrylate, and N,N-dimethylaminopropyl(meth)acrylate.

Furthermore, a modified acrylic resin formed with a urethane group- or urea group-containing acrylic monomer may preferably be used.

Among these, from the viewpoint of aqueous ink resistance, an alkyl (meth)acrylate such as lauryl(meth)acrylate and an aliphatic cyclic structure-containing (meth)acrylate such as t-butylcyclohexyl(meth)acrylate are particularly preferable.

(3) A Novolac Resin

Furthermore, as the specific polymer, a novolac resin may be used, this being a resin formed by condensation of a phenol and an aldehyde under acidic conditions.

Preferred examples of the novolac resin include a novolac resin obtained from phenol and formaldehyde, a novolac resin obtained from m-cresol and formaldehyde, a novolac resin obtained from p-cresol and formaldehyde, a novolac resin obtained from o-cresol and formaldehyde, a novolac resin obtained from octylphenol and formaldehyde, a novolac resin obtained from mixed m-/p-cresol and formaldehyde, and a novolac resin between a mixture of phenol/cresol (any of m-, p-, o- or m-/p-, o-/p-mixtures) and formaldehyde.

With regard to these novolac resins, those having a weight-average molecular weight of 800 to 200,000 and a number-average molecular weight of 400 to 60,000 are preferable.

An epoxy resin having a hydroxy group in a side chain may be used as a specific polymer. A preferred example of the epoxy resin is an epoxy resin formed by polymerization, as a starting material monomer, of an adduct of bisphenol A and epichlorohydrin. The epoxy resin preferably has a weight-average molecular weight of at least 800 but no greater than 200,000, and a number-average molecular weight of at least 400 but no greater than 60,000.

Among specific polymers, polyvinyl butyral derivatives are particularly preferable from the viewpoint of rinsing properties and printing durability when the polymer is formed into the relief-forming layer.

In polymers of any embodiment described above, the content of the hydroxyl group contained in the specific polymer in the present invention is preferably 0.1 to 15 mmol/g, and more preferably 0.5 to 7 mmol/g.

In the resin composition, the specific polymer may be used only in one kind, or in two or more kinds in combination.

From the viewpoint of satisfying figure-holding properties, water-resisting properties and engraving sensitivity of a coated film in a balanced manner, relative to the total nonvolatile component, the content of the binder polymer for use in the invention is preferably 2 to 95 wt %, more preferably 5 to 80 wt %, and particularly preferably 10 to 60 wt %.

For the resin composition for laser engraving, in addition to the above-mentioned specific polymer, a known polymer not included in the specific polymer such as a polymer having no hydroxyl group may be used alone or in combination with the specific polymer. Hereinafter, such polymer is also referred to as a common polymer.

The common polymer constitutes the main component contained in the resin composition for laser engraving with the specific polymer. A common polymer compound not included in the specific polymer can be suitably selected and be used in one kind or in two or more kinds. Particularly, when the relief-forming plate precursor is used for a printing plate precursor, the selection of the binder polymer is necessary while considering various performances such as laser engraving properties, ink-accepting/giving properties and engraving residue dispersibility.

The common polymer may be selected from a polystyrene resin, polyester resin, polyamide resin, polyureapolyamide-imide resin, polyurea resin, polyamide imide resin, polyurethane resin, polysulfone resin, polyether sulfone resin, polyimide resin, polycarbonate resin, hydroxyethylene unit-containing hydrophilic polymer, acrylic resin, acetal resin, epoxy resin, polycarbonate resin, rubber, thermoplastic elastomer, etc.

For example, from the viewpoint of the laser engraving sensitivity, polymers having a partial structure capable of being thermally decomposed by exposure or heating are preferable. Examples of such polymers preferably include those described in JP-A-2008-163081, paragraph 0038. Moreover, for example, when the purpose is to form a film having softness and flexibility, a soft resin or a thermoplastic elastomer is selected. It is described in detail in JP-A-2008-163081, paragraphs 0039 to 0040. Furthermore, from the viewpoint of easy preparation of the composition for the relief-forming layer, and the improvement of resistance properties for an oil-based ink in the obtained relief printing plate, the use of a hydrophilic or alcoholphilic polymer is preferable. As the hydrophilic polymer, those described in detail in JP-A-2008-163081, paragraph 0041 can be used.

(Component D) Compound Having Hydrolyzable Silyl Group and/or a Silanol Group

The 'hydrolyzable silyl group' of (Component A) a compound having a hydrolyzable silyl group and/or a silanol group used in the resin composition for laser engraving of the present invention is a silyl group that is hydrolyzable; examples of hydrolyzable groups include an alkoxy group, a mercapto group, a halogen atom, an amide group, an acetoxy group, an amino group, and an isopropenoxy group. A silyl group is hydrolyzed to become a silanol group, and a silanol group undergoes dehydration-condensation to form a siloxane bond. Such a hydrolyzable silyl group or a silanol group is preferably one represented by Formula (1) below.

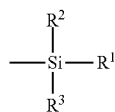

(1)

wherein at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group. The remainder of $R^1$ to $R^3$ independently denote a hydrogen atom, a halogen atom, or a monovalent organic substituent, and examples thereof include an alkyl group, an aryl group, an alkenyl group, an alkynyl group, and an aralkyl group.

In Formula (1) above, the hydrolyzable group bonded to the silicon atom is particularly preferably an alkoxy group or a halogen atom, and more preferably an alkoxy group.

From the viewpoint of rinsing properties and printing durability, the alkoxy group is preferably an alkoxy group having 1 to 30 carbon atoms, more preferably an alkoxy group having 1 to 15 carbon atoms, yet more preferably an alkoxy group having 1 to 5 carbon atoms, particularly preferably an alkoxy group having 1 to 3 carbon atoms, and most preferably a methoxy group or an ethoxy group.

Furthermore, examples of the halogen atom include an F atom, a Cl atom, a Br atom, and an I atom, and from the viewpoint of ease of synthesis and stability it is preferably a Cl atom or a Br atom, and more preferably a Cl atom.

Component D in the present invention is preferably a compound having one or more groups represented by Formula (1) above, and more preferably a compound having two or more. A compound having two or more hydrolyzable silyl groups is particularly preferably used. That is, a compound having in the molecule two or more silicon atoms having a hydrolyzable group bonded thereto is preferably used. The number of silicon atoms having a hydrolyzable group bond thereto contained in Component D is preferably at least 2 but no greater than 6, and most preferably 2 or 3.

A range of 1 to 4 of the hydrolyzable groups may bond to one silicon atom, and the total number of hydrolyzable groups in Formula (1) is preferably in a range of 2 or 3. It is particularly preferable that three hydrolyzable groups are bonded to a silicon atom. When two or more hydrolyzable groups are bonded to a silicon atom, they may be identical to or different from each other.

Specific preferred examples of the alkoxy group include a methoxy group, an ethoxy group, a propoxy group, an isopropoxy group, a butoxy group, a tert-butoxy group, a phenoxy group, and a benzyloxy group. A plurality of each of these alkoxy groups may be used in combination, or a plurality of different alkoxy groups may be used in combination.

Examples of the alkoxysilyl group having an alkoxy group bonded thereto include a trialkoxysilyl group such as a trimethoxysilyl group, a triethoxysilyl group, a triisopropoxysilyl group, or a triphenoxysilyl group; a dialkoxymonoalkylsilyl group such as a dimethoxymethylsilyl group or a diethoxymethylsilyl group; and a monoalkoxydialkylsilyl group such as a methoxydimethylsilyl group or an ethoxydimethylsilyl group.

Component D preferably has at least a sulfur atom, an ester bond, a urethane bond, an ether bond, a urea bond, or an imino group.

Among them, from the viewpoint of crosslinkability, Component D preferably comprises a sulfur atom. From the viewpoint of removability (rinsing properties) of engraving residue it is preferable for Component D to comprise an ester bond, a urethane bond, or an ether bond (in particular, an ether bond contained in an oxyalkylene group), which are easily decomposed by aqueous alkali. Component D comprising a sulfur atom functions as a vulcanizing agent or a vulcanization accelerator when carrying out a vulcanization treatment, thus promoting a reaction (crosslinking) of (Component B) a conjugated diene constitutional unit-containing polymer. As a result, rubber elasticity necessary as a relief printing plate is achieved. Furthermore, the strength of the crosslinked relief-forming layer and thus that of the relief layer are improved.

Furthermore, Component D in the present invention is preferably a compound that comprises no ethylenically unsaturated bond.

As Component D in the present invention, there can be cited a compound in which a plurality of groups represented by Formula (1) above are bonded via a divalent linking group, and from the viewpoint of the effect, such a divalent linking group is preferably a linking group having a sulfide group (—S—), an imino group (—N(R)—) or a urethane bond (—OCON(R)— or —N(R)COO—). R denotes a hydrogen atom or a substituent. Examples of the substituent denoted by R include an alkyl group, an aryl group, an alkenyl group, an alkynyl group, and an aralkyl group.

A method for synthesizing Component D is not particularly limited, and synthesis can be carried out by a known method. As one example, a representative synthetic method for Component D comprising a linking group having the above-mentioned specific structure is shown below.

<Synthetic Method for Component D Having a Sulfide Group as Linking Group>

A synthetic method for Component D having a sulfide group as a linking group (hereinafter, called as appropriate a 'sulfide linking group-containing Component D') is not particularly limited, but specific examples thereof include reaction of Component D having a halogenated hydrocarbon group with an alkali metal sulfide, reaction of Component D having a mercapto group with a halogenated hydrocarbon, reaction of Component D having a mercapto group with Component D having a halogenated hydrocarbon group, reaction of Component D having a halogenated hydrocarbon group with a mercaptan, reaction of Component D having an ethylenically unsaturated double bond with a mercaptan, reaction of Component D having an ethylenically unsaturated double bond with a Component D having a mercapto group, reaction of a compound having an ethylenically unsaturated double bond with Component D having a mercapto group, reaction of a ketone with Component D having a mercapto group, reaction of a diazonium salt with a Component D having a mercapto group, reaction of Component D having a mercapto group with an oxirane, reaction of Component D having a mercapto group with a Component D having an oxirane group, reaction of a mercaptan with Component D having an oxirane group, and reaction of Component D having a mercapto group with an aziridine.

<Synthetic Method for Component D Having an Imino Group>

A synthetic method for Component D having an imino group as a linking group (hereinafter, called as appropriate an 'imino linking group-containing Component D') is not particularly limited, but specific examples include reaction of Component D having an amino group with a halogenated hydrocarbon, reaction of Component D having an amino group with Component D having a halogenated hydrocarbon group, reaction of Component D having a halogenated hydrocarbon group with an amine, reaction of Component D having an amino group with an oxirane, reaction of Component D having an amino group with Component D having an oxirane group, reaction of an amine with Component D having an oxirane group, reaction of Component D having an amino group with an aziridine, reaction of Component D having an ethylenically unsaturated bond with an amine, reaction of Component D having an ethylenically unsaturated bond with Component D having an amino group, reaction of a compound having an ethylenically unsaturated bond with Component D having an amino group, reaction of a compound having an acetylenically unsaturated bond with Component D having an amino group, reaction of Component D having an imine-based unsaturated double bond with an organic alkali metal compound, reaction of Component D having an imine-based unsaturated bond with an organic alkaline earth metal compound, and reaction of a carbonyl compound with Component D having an amino group.

<Synthetic Method for Component D Having a Urea Bond (Ureylene Group)>

A synthetic method for Component D having an ureylene group (hereinafter, called as appropriate a 'ureylene linking group-containing Component D') as a linking group is not particularly limited, but specific examples include synthetic methods such as reaction of Component D having an amino group with an isocyanate ester, reaction of Component D having an amino group with Component D having an isocyanate ester, and reaction of an amine with Component D having an isocyanate ester.

Component D is preferably a compound represented by Formula (A-1) or Formula (A-2) below.

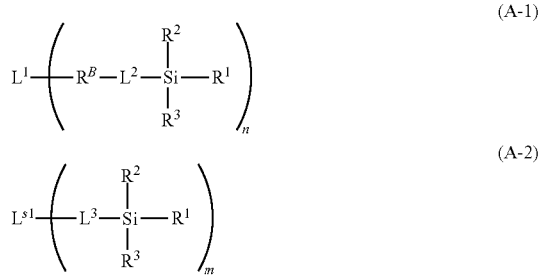

(In Formula (A-1) and Formula (A-2), $R^B$ denotes an ester bond, an amide bond, a urethane bond, a urea bond, or an imino group, $L^1$ denotes an n-valent linking group, $L^2$ denotes a divalent linking group, $L^{s1}$ denotes an m-valent linking group, $L^3$ denotes a divalent linking group, n and m independently denote an integer of 1 or greater, and $R^1$ to $R^3$ independently denote a hydrogen atom, a halogen atom, or a monovalent organic substituent. In addition, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group.)

$R^1$ to $R^3$ in Formula (A-1) and Formula (A-2) above have the same meanings as those of $R^1$ to $R^3$ in Formula (1) above, and preferred ranges are also the same.

From the viewpoint of rinsing properties and film strength, $R^B$ above is preferably an ester bond or a urethane bond, and is more preferably an ester bond.

The divalent or n-valent linking group denoted by $L^1$ to $L^3$ above is preferably a group formed from at least one type of atom selected from the group consisting of a carbon atom, a hydrogen atom, an oxygen atom, a nitrogen atom, and a sulfur atom, and is more preferably a group formed from at least one type of atom selected from the group consisting of a carbon atom, a hydrogen atom, an oxygen atom, and a sulfur atom. The number of carbon atoms of $L^1$ to $L^3$ above is preferably 2 to 60, and more preferably 2 to 30. Furthermore, $L^3$ above preferably do not have any of an ester bond, an amide bond, a urethane bond, a urea bond, and an imino group.

The m-valent linking group denoted by $L^{s1}$ above is preferably a group formed from a sulfur atom and at least one type of atom selected from the group consisting of a carbon atom, a hydrogen atom, an oxygen atom, a nitrogen atom, and a sulfur atom, and is more preferably an alkylene group or a group formed by combining two or more from an alkylene group, a sulfide group, and an imino group. The number of carbon atoms of $L^{s1}$ above is preferably 2 to 60, and more preferably 6 to 30.

n and m above are independently integers of 1 to 10, more preferably integers of 2 to 10, yet more preferably integers of 2 to 6, and particularly preferably 2.

From the viewpoint of removability (rinsing properties) of engraving residue, the n-valent linking group denoted by $L^1$ and/or the divalent linking group denoted by $L^2$, or the divalent linking group denoted by $L^3$ preferably has an ether bond, and more preferably has an ether bond contained in an oxyalkylene group, and especially preferably has an ether bond contained in an polyoxyalkylene group.

Among compounds represented by Formula (A-1) or Formula (A-2), from the viewpoint of crosslinkability, etc., the n-valent linking group denoted by $L^1$ and/or the divalent linking group denoted by $L^2$ in Formula (A-1) are preferably groups having a sulfur atom.

Specific examples of Component D that can be applied to the present invention are shown below. Examples thereof include vinyltrichlorosilane, vinyltrimethoxysilane, vinyltriethoxysilane, β-(3,4-epoxycyclohexyl)ethyltrimethaxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, p-styryltrimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-mercaptopropyltriethoxysilane, mercaptomethyltrimethoxysilane, dimethoxy-3-mercaptopropylmethylsilane, 2-(2-aminoethylthioethyl)diethoxymethylsilane, 3-(2-acetoxyethylthiopropyl)dimethoxymethylsilane, 2-(2-aminoethylthioethyl)triethoxysilane, dimethoxymethyl-3-(3-phenoxypropylthiopropyl)silane, bis(triethoxysilylpropyl)

disulfide, bis(triethoxysilylpropyl)tetrasulfide, 1,4-bis(triethoxysilyl)benzene, bis(triethoxysilyl)ethane, 1,6-bis(trimethoxysilyl)hexane, 1,8-bis(triethoxysilyl)octane, 1,2-bis(trimethoxysilyl)decane, bis(triethoxysilylpropyl)amine, bis(trimethoxysilylpropyl)urea, γ-chloropropyltrimethoxysilane, γ-ureidopropyltriethoxysilane, γ-ureidopropyltriethoxysilane, trimethylsilanol, diphenylsilanediol, and triphenylsilanol. Other than the above, the compounds shown below can be cited as preferred examples, but the present invention should not be construed as being limited thereto.

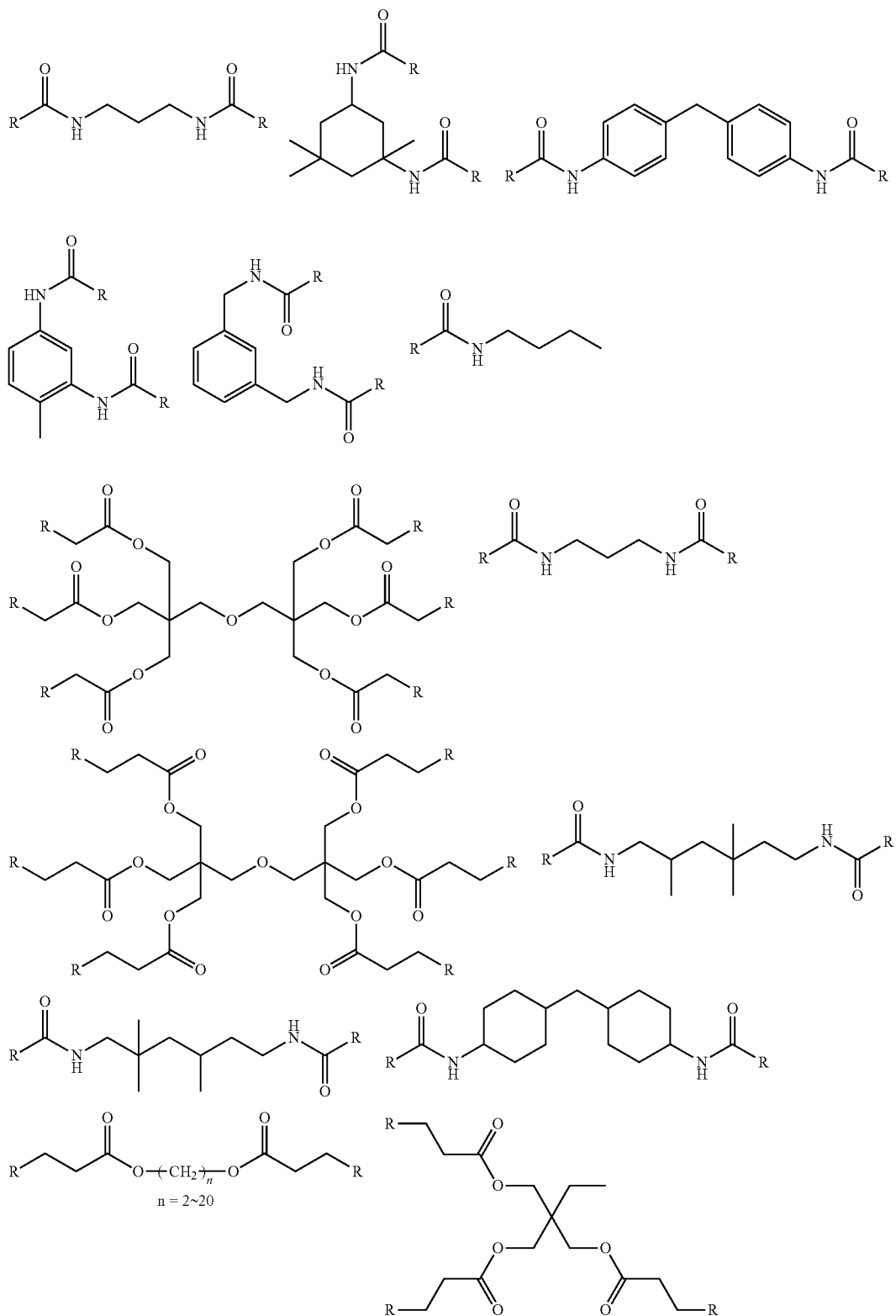

-continued
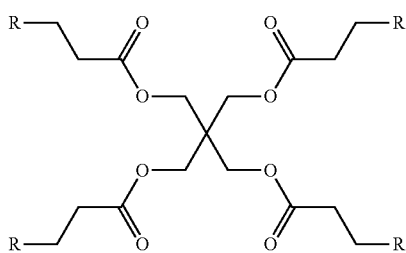
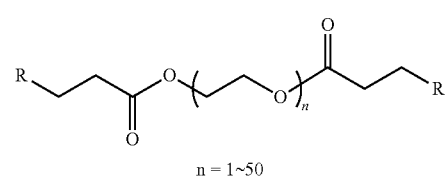
n = 1~50
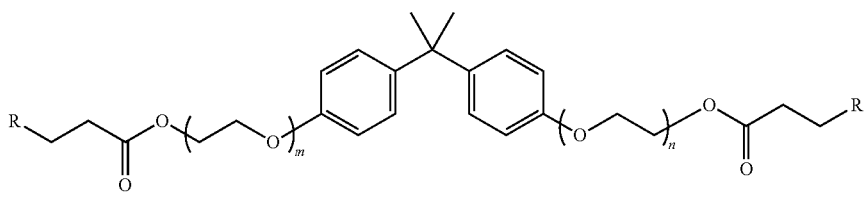
m + n = 2~50
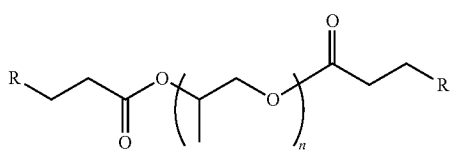
n = 1~50
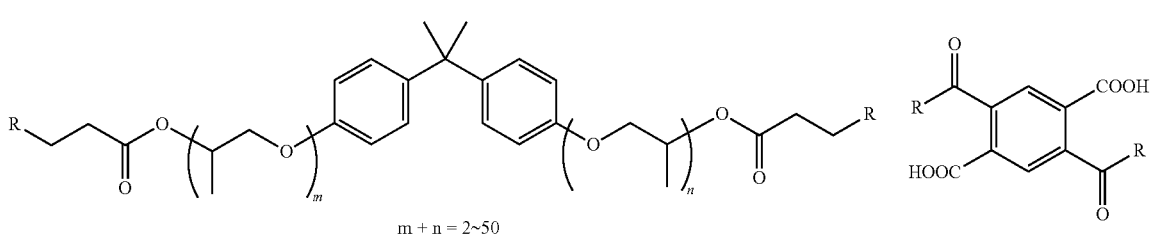
m + n = 2~50
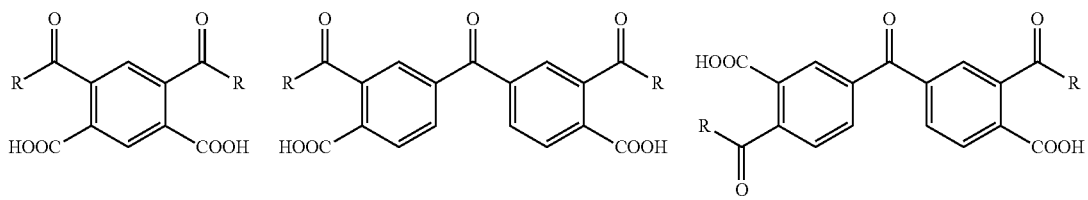
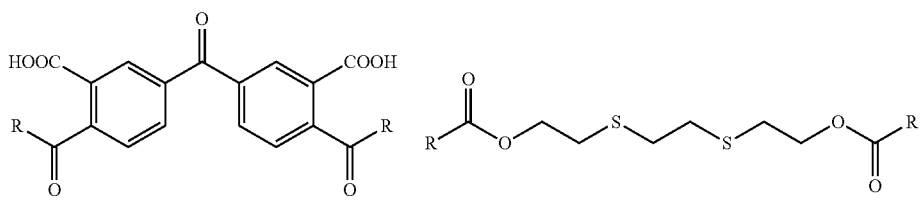
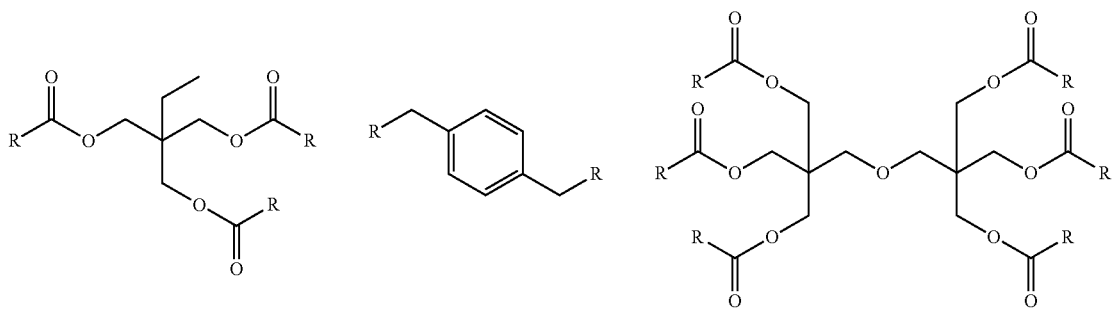

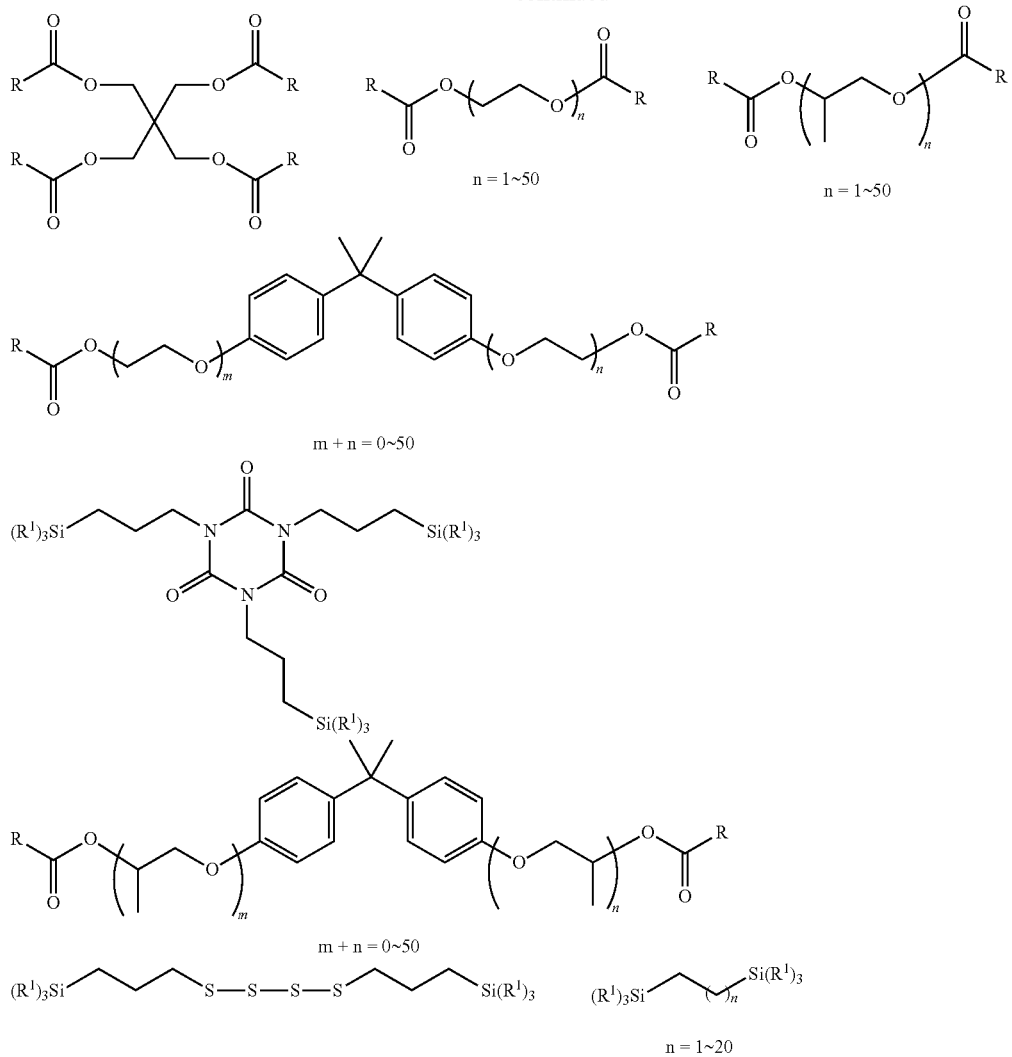
In each of the formulae above, R denotes a partial structure selected from the structures below. When a plurality of Rs and R¹s are present in the molecule, they may be identical to or different from each other, and are preferably identical to each other in terms of synthetic suitability.
R:
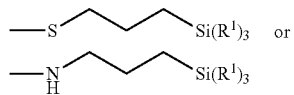
R¹:
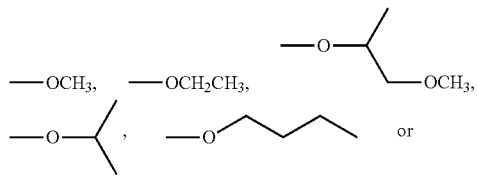
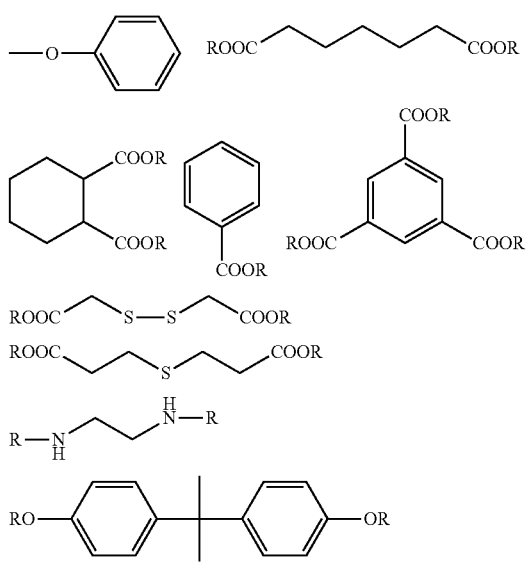

-continued

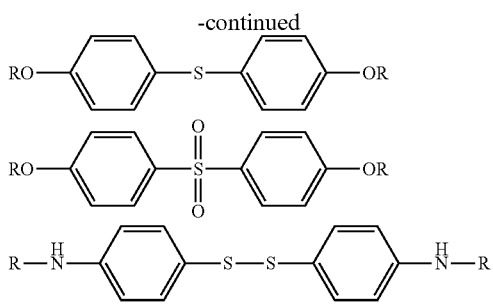

In each of the formulae above, R denotes a partial structure selected from the structures below. When a plurality of Rs and $R^1$s are present in the molecule, they may be identical to or different from each other, and are preferably identical to each other in terms of synthetic suitability.

R:

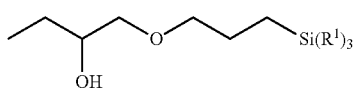

Component D may be obtained by synthesis as appropriate, but use of a commercially available product is preferable in terms of cost. Since Component D corresponds to for example commercially available silane products or silane coupling agents from Shin-Etsu Chemical Co., Ltd., Dow Corning Toray, Momentive Performance Materials Inc., Chisso Corporation, etc., the resin composition of the present invention may employ such a commercially available product by appropriate selection according to the intended application.

As Component D in the present invention, a partial hydrolysis-condensation product obtained using one type of compound having a hydrolyzable silyl group and/or a silanol group or a partial cohydrolysis-condensation product obtained using two or more types may be used. Hereinafter, these compounds may be called 'partial (co)hydrolysis-condensation products'.

Among silane compounds as partial (co)hydrolysis-condensation product precursors, from the viewpoint of versatility, cost, and film compatibility, a silane compound having a substituent selected from a methyl group and a phenyl group as a substituent on the silicon is preferable, and specific preferred examples of the precursor include methyltrimethoxysilane, methyltriethoxysilane, phenyltrimethoxysilane, phenyltriethoxysilane, dimethyldimethoxysilane, dimethyldiethoxysilane, diphenyldimethoxysilane, and diphenyldiethoxysilane.

In this case, as a partial (co)hydrolysis-condensation product, it is desirable to use a dimer (2 moles of silane compound is reacted with 1 mole of water to eliminate 2 moles of alcohol, thus giving a disiloxane unit) to 100-mer of the above-mentioned silane compound, preferably a dimer to 50-mer, and yet more preferably a dimer to 30-mer, and it is also possible to use a partial cohydrolysis-condensation product formed using two or more types of silane compounds as starting materials.

As such a partial (co)hydrolysis-condensation product, ones commercially available as silicone alkoxy oligomers may be used (e.g. those from Shin-Etsu Chemical Co., Ltd.) or ones that are produced in accordance with a standard method by reacting a hydrolyzable silane compound with less than an equivalent of hydrolytic water and then removing by-products such as alcohol and hydrochloric acid may be used. When the production employs, for example, an acyloxysilane or an alkoxysilane described above as a hydrolyzable silane compound starting material, which is a precursor, partial hydrolysis-condensation may be carried out using as a reaction catalyst an acid such as hydrochloric acid or sulfuric acid, an alkali metal or alkaline earth metal hydroxide such as sodium hydroxide or potassium hydroxide, or an alkaline organic material such as triethylamine, and when the production is carried out directly from a chlorosilane, water and alcohol may be reacted using hydrochloric acid by-product as a catalyst.

(Component D) A compound having a hydrolyzable silyl group and/or a silanol group is shown below. In the formulae, Et denotes an ethyl group, and Me is a methyl group.

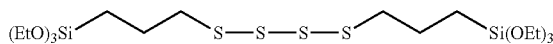
D-1

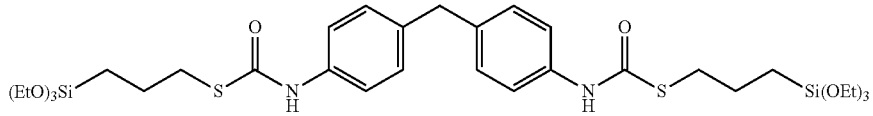
D-2

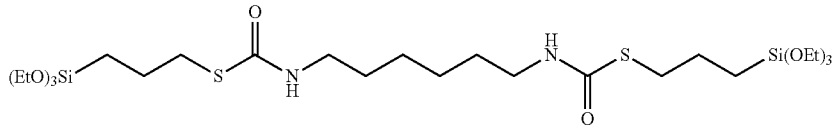
D-3

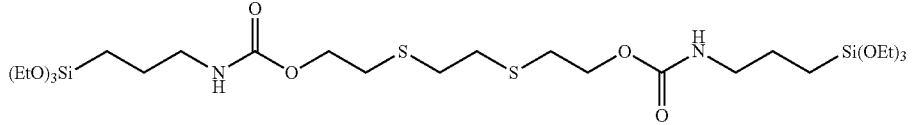
D-4

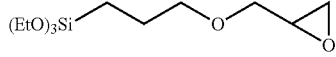
D-5

-continued
D-6
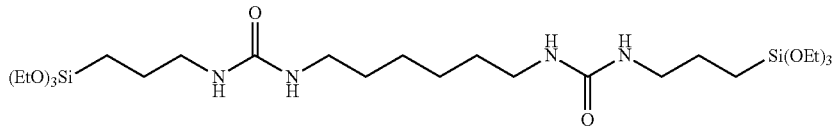
D-7
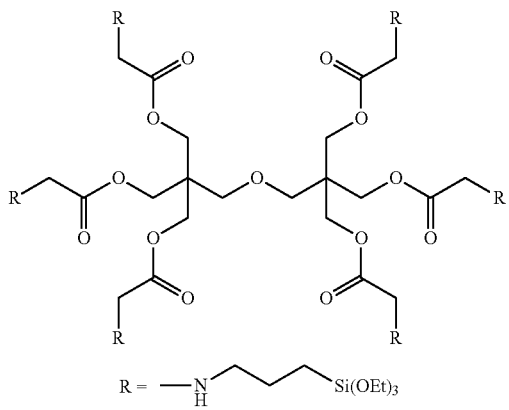
D-8
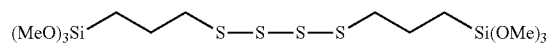
D-9
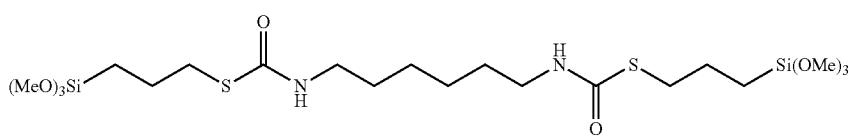
D-10
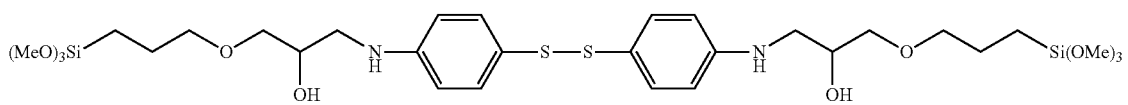
D-11
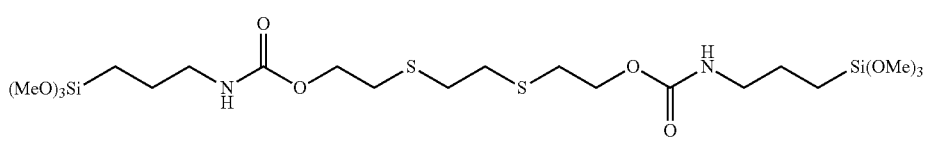
D-12
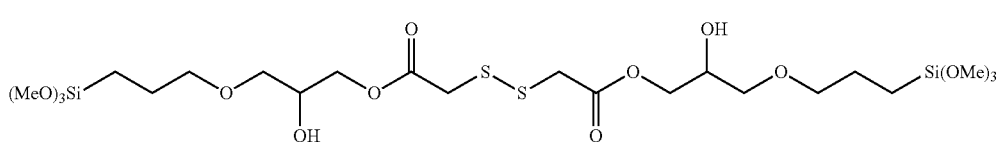
D-13
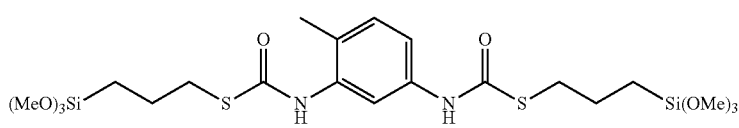
D-14
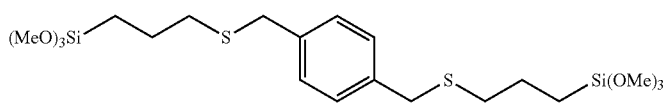
D-15
D-16
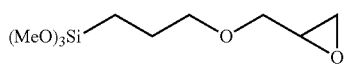
D-17
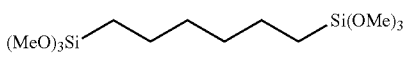

-continued
D-18
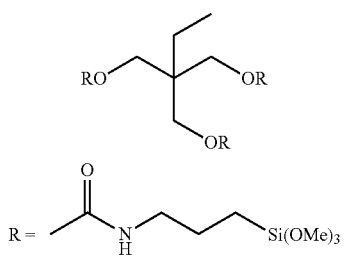
D-19
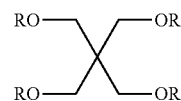
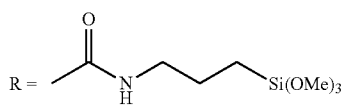
D-20
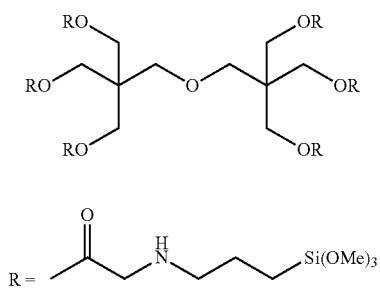
D-21
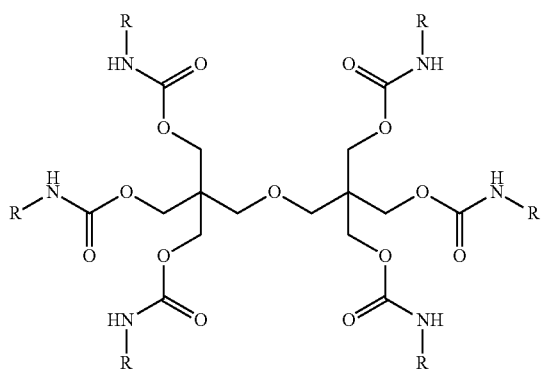
D-22
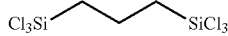
Cl₃Si⌒⌒SiCl₃
D-23
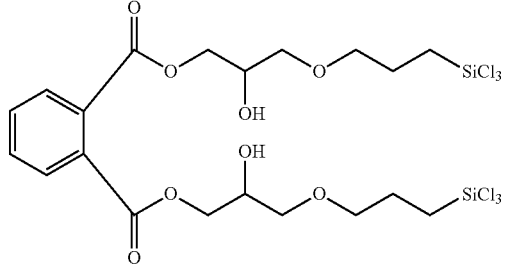
D-24
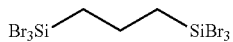
Br₃Si⌒⌒SiBr₃
D-25
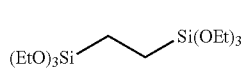
(EtO)₃Si⌒Si(OEt)₃
D-26
Mixture of
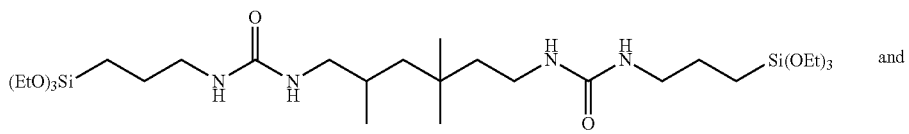 and
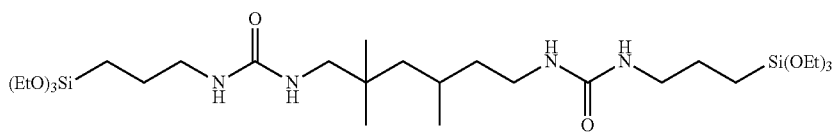
D-27
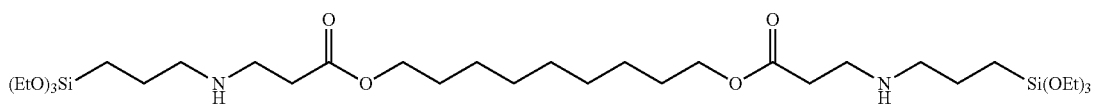
D-28
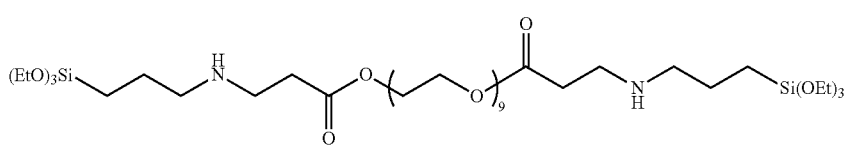

-continued

D-29
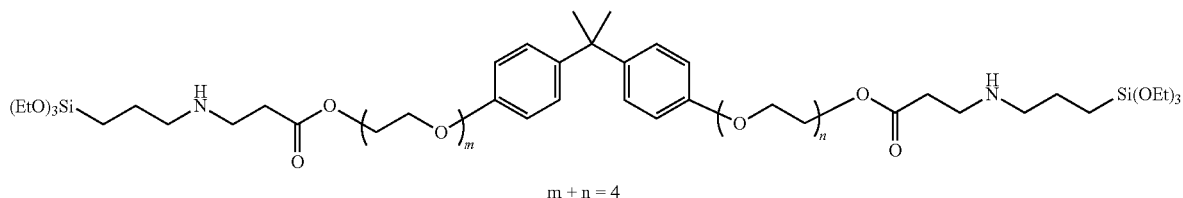
m + n = 4

D-30
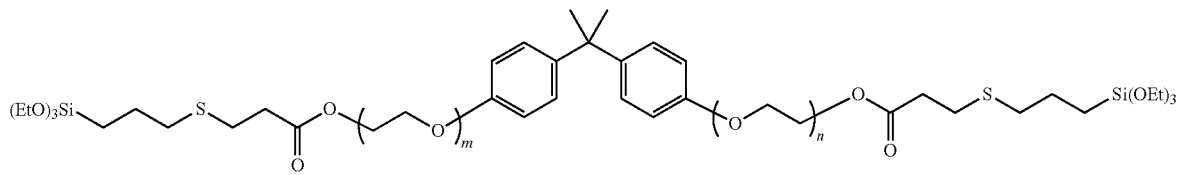
m + n = 4

D-31
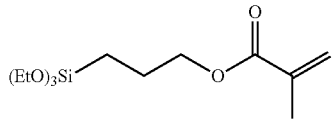

D-32
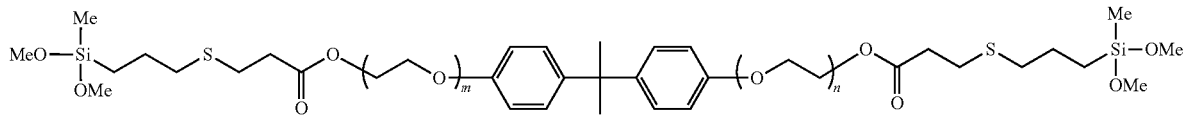
m + n = 10

With regard to Component D in the resin composition of the present invention, only one type may be used or two or more types may be used in combination.

The content of Component D contained in the resin composition of the present invention is preferably in the range of 0.1 to 80 wt % on a solids content basis, more preferably in the range of 1 to 40 wt %, and most preferably in the range of 5 to 30 wt %.

(Component E) a Crosslinking Accelerator

The crosslinking accelerator is preferably one or more selected from the group consisting of (Component E-1) an acid, (Component E-2) a base and (Component E-3) a polymerization initiator.

In order to accelerate the formation of the crosslinked structure of Component D, the resin composition of the present invention contains preferably an alcohol exchange reaction catalyst. As the alcohol exchange reaction catalyst, reaction catalysts used commonly in a silane coupling reaction can be applied without limitation. An acid or base, and a metal complex catalyst that are representative alcohol exchange reaction catalysts are explained successively below.

Examples of the acids include protonic acids (such as hydrochloric acid, sulfuric acid, phosphoric acid), Lewis acids (such as $AlCl_3$, $ZnCl_2$) and photoacid generators.

Examples of the bases include inorganic bases (such as NaOH, $Na_2CO_3$), metal alkoxides (such as MeONa, t-BuOK) and amines.

In order to accelerate the addition reaction of the Component B, the resin composition of the present invention contains preferably (Component E-3) a polymerization initiator.

As the polymerization initiator, a radical polymerization initiator can preferably be used.

They are explained in detail below.

(Component E1) An Acidic or (Component E-2) a Basic Catalyst

As the catalyst, an acidic or basic compound is used as it is or in the form of a solution in which it is dissolved in a solvent such as water or an organic solvent (hereinafter, also called an acidic catalyst or basic catalyst respectively). The concentration when dissolved in a solvent is not particularly limited, and it may be selected appropriately according to the properties of the acidic or basic compound used, desired catalyst content, etc.

Examples of the acidic catalyst include a hydrogen halide such as hydrochloric acid, nitric acid, sulfuric acid, sulfurous acid, hydrogen sulfide, perchloric acid, hydrogen peroxide, carbonic acid, a carboxylic acid such as formic acid or acetic acid, a carboxylic acid in which R of the structural formula RCOOH is substituted with another element or substituent, a sulfonic acid such as benzenesulfonic acid, phosphoric acid, a heteropoly acid, and an inorganic solid acid.

Examples of the basic catalyst include an ammoniacal base such as aqueous ammonia, an amine, an alkali metal hydroxide, an alkali metal alkoxide, an alkaline earth oxide, a quaternary ammonium salt compound, and a quaternary phosphonium salt compound.

Examples of the amine include (a) a hydrogenated nitrogen compound such as hydrazine; (b) an aliphatic amine, alicyclic amine or aromatic amine; (c) a condensed ring-containing cyclic amine; (d) an oxygen-containing amine such as an amino acid, an amide, an alcoholamine, an ether amine, an imide or a lactam; and (e) a heteroelement-containing amine having a heteroatom such as S or Se.

The cyclic amine (c) comprising a condensed ring is a cyclic amine in which at least one nitrogen atom is contained in a ring skeleton forming a condensed ring; examples thereof include 1,8-diazabicyclo[5.4.0]undec-7-ene, 1,5-diazabicyclo[4.3.0]non-5-ene, and 1,4-diazabicyclo[2.2.2]octane, and 1,8-diazabicyclo[5.4.0]undec-7-ene is preferable.

Examples of the oxygen-containing amine (d) such as an amino acid, an amide, an alcoholamine, an ether amine, an imide, or a lactam include phthalimide, 2,5-piperazinedione, maleimide, caprolactam, pyrrolidone, morpholine, glycine, alanine, and phenylalanine.

(Component E-3) A Polymerization Initiator

In the resin composition for laser engraving of the present invention, when a polymerizable compound is used to producing relief forming layer, it is preferable for (Component E-3) a polymerization initiator to be contained.

With regard to the polymerization initiator, one known to a person skilled in the art may be used without any limitations. Radical polymerization initiators, which are preferred polymerization initiators, are explained in detail below, but the present invention should not be construed as being limited to these descriptions.

In the present invention, preferred examples of the radical polymerization initiator include (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, (k) a compound having a carbon halogen bond, and (l) an azo-based compound.

As (a) aromatic ketones to (l) azo-based compounds, compounds described in JP-A-2010-69763, paragraphs 0198 to 0249 can preferably be used.

Preferable examples of the radical polymerization initiators in the present invention include aforementioned (a) aromatic ketones, (b) onium salt compounds, (c) organic peroxides, (e) hexaarylbiimidazole compounds, (i) metallocene compounds, (k) compounds having a carbon-halogen bond and (l) azo-based compounds, and (c) organic peroxides and (l) azo-based compounds can be used more preferably.

Examples of (c) organic peroxides and (l) azo-based compounds include compounds as shown below.

(c) Organic Peroxides

Preferable (c) organic peroxides usable as the radical polymerization initiator in the present invention include all most all organic compounds having one or more oxygen-oxygen bonds in the molecule, and examples thereof include methyl ethyl ketone peroxide, cyclohexanone peroxide, 3,3,5-trimethylcyclohexa none peroxide, methylcyclohexanone peroxide, acetylacetone peroxide, 1,1-bis(tertiarybutylperoxy)-3,3,5-trimethylcyclohexane, 1,1-bis(tertiarybutylperoxy)cyclohexane, 2,2-bis(tertiarybutylperoxy)butane, tertiarybutyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, ditertiarybutyl peroxide, tertiarybutylcumyl peroxide, tertiarybutylperoxy benzoate, dicumyl peroxide, bis(tertiarybutylperoxyisopropyl)benzene, 2,5-dimethyl-2,5-di(tertiarybutylperoxy)hexane, 2,5-xanoyl peroxide, succinic peroxide, benzoyl peroxide, 2,4-dichlorobenzoyl peroxide, metha-toluoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tertiarybutylperoxy acetate, tertiarybutylperoxy pivalate, tertiarybutylperoxy neodecanoate, tertiarybutylperoxy octanoate, tertiarybutylperoxy-3,5,5-trimethyl hexanoate, tertiarybutylperoxy laurate, tertiarycarbonate, 3,3'4,4'-tetra-(tertiarybutylperoxycarbonyl)benzophenone, 3,3'4,4'-tetra-(tertiaryamylperoxy carbonyl)benzophenone, 3,3'4,4'-tetra-(tertiaryhexylperoxy carbonyl)benzophenone, 3,3'4,4'-tetra-(tertiaryoctylperoxy carbonyl)benzophenone, 3,3'4,4'-tetra-(cumylperoxycarbonyl)benzophenone, 3,3'4,4'-tetra-(p-isopropylcumylperoxycarbonyl)benzophenone, carbonyl di(tertiarybutylperoxy dihydrogen diphthalate), and carbonyl di(tertiaryhexylperoxy dihydrogen diphthalate).

Among these, 3,3'4,4'-tetra-(tertiarybutylperoxycarbonyl)benzophenone, 3,3'4,4'-tetra-(tertiaryamylperoxycarbonyl)benzophenone, 3,3'4,4'-tetra-(tertiaryhexylperoxycarbonyl)benzophenone, 3,3'4,4'-tetra-(tertiaryoctylperoxycarbonyl)benzophenone, tertiarybutylperoxy benzoate, dicumyl peroxide, 3,3'4,4'-tetra-(cumylperoxycarbonyl)benzophenone, 3,3'4,4'-tetra-(p-isopropylcumylperoxycarbonyl)benzophenone, di-tertiarybutyldiperoxy isophthalate etc. are preferable in point of crosslinking properties and storage stability of the film, and tertiarybutylperoxy benzoate, dicumyl peroxide and tertiarybutyl hydroperoxide are more preferable.

The organic peroxide is preferable as the polymerization initiator in the present invention from the viewpoint of the crosslinking properties of the film (relief-forming layer), and, furthermore, as an unexpected effect, it was found that the organic peroxide is particularly preferable from the viewpoint of improving the engraving sensitivity.

(l) azo-based compound

Preferable (l) azo-based compounds usable as the radical polymerization initiator in the present invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), 2,2'-dimethyl azobisisobutyrate, 2,2'-azobis(2-methylpropionamidoxime), 2,2'-azobis[2-(2-imidazoline-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide], and 2,2'-azobis(2,4,4-trimethylpentane), etc.

Meanwhile, in the present invention, the above-mentioned (c) organic peroxide is preferable as the polymerization initiator in the present invention from the viewpoint of the crosslinking properties of the film (relief-forming layer), and particularly preferable from the viewpoint of improving the engraving sensitivity.

The content of the crosslinking accelerator (or polymerization initiator) in the resin composition for laser engraving is preferably 0.01 to 10 wt % relative to the total nonvolatile component of the relief-forming layer, and more preferably 0.1 to 3 wt %. Because, the content of the polymerization initiator of 0.01 wt % or more gives the effect of the addition thereof to perform quickly the crosslinking of the crosslinkable relief-forming layer, and, the content of 10 wt % or less does not make other components insufficient to give the printing durability sufficient for the use as the relief printing plate.

(Component F) Photothermal Conversion Agent Capable of Absorbing Light Having a Wavelength of 700 to 1,300 nm The resin composition or the relief printing plate precursor of the present invention preferably comprises furthermore the photothermal conversion agent. That is, it is considered that the photothermal conversion agent in the present invention absorbs the laser light and generates heat to thereby accelerate the thermal decomposition of the cured product at the laser engraving. Accordingly, the selection of the photothermal conversion agent that absorbs the laser light having the wavelength for use in the engraving is preferable.

When a laser (a YAG laser, a semiconductor laser, a fiber laser, a surface emitting laser, etc.) emitting infrared at a wavelength of 700 nm to 1,300 nm is used as a light source for laser engraving a relief printing plate precursor of the present invention, it is preferable for the relief-forming layer in the present invention to comprise a photothermal conversion agent that can absorb light having a wavelength of 700 to 1,300 nm.

As the photothermal conversion agent in the present invention, various types of dye or pigment are used.

With regard to the photothermal conversion agent, examples of dyes that can be used include commercial dyes and known dyes described in publications such as 'Senryo Binran' (Dye Handbook) (Ed. by The Society of Synthetic Organic Chemistry, Japan, 1970). Specific examples include dyes having a maximum absorption wavelength at 700 to 1,300 nm, such as azo dyes, metal complex salt azo dyes, pyrazolone azo dyes, naphthoquinone dyes, anthraquinone dyes, phthalocyanine dyes, carbonium dyes, diimmonium compounds, quinone imine dyes, methine dyes, cyanine dyes, squarylium dyes, pyrylium salts, and metal thiolate complexes.

Example of the dyes preferably used in the present invention include cyanine-based dyes such as a heptamethine cyanine dye, oxonol-based dyes such as a pentamethine oxonol dye, phthalocyanine-based dyes, and dyes described in JP-A-2010-069763, paragraphs 0254 to 0265 and 0270 to 0272.

With regard to the photothermal conversion agent used in the present invention, examples of pigments include commercial pigments and pigments described in the Color Index (C.I.) Handbook, 'Saishin Ganryo Binran' (Latest Pigments Handbook) (Ed. by Nippon Ganrya Gijutsu Kyokai, 1977), 'Saisin Ganryo Duyogijutsu' (Latest Applications of Pigment Technology) (CMC Publishing, 1988), 'Insatsu Inki Gijutsu' (Printing Ink Technology) CMC Publishing, 1984).

Examples of the type of pigment include black pigments, yellow pigments, orange pigments, brown pigments, red pigments, violet pigments, blue pigments, green pigments, fluorescent pigments, metal powder pigments, and other polymer-bonding colorants. Specific examples include insoluble azo pigments, azo lake pigments, condensed azo pigments, chelate azo pigments, phthalocyanine-based pigments, anthraquinone-based pigments, perylene and perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black. Among these pigments, carbon black is preferable.

Any carbon black, regardless of classification by ASTM and application (e.g. for coloring, for rubber, for dry cell, etc.), may be used as long as dispersibility, etc. in the composition is stable. Carbon black includes for example furnace black, thermal black, channel black, lamp black, and acetylene black. In order to make dispersion easy, a black colorant such as carbon black may be used as color chips or a color paste by dispersing it in nitrocellulose or a binder in advance using, as necessary, a dispersant, and such chips and paste are readily available as commercial products.

In the present invention, it is possible to use carbon black having a relatively low specific surface area and a relatively low dibutyl phthalate (DBP) absorption and also finely divided carbon black having a large specific surface area. Preferred examples of carbon black include Printex (registered trademark) U, Printex (registered trademark) A, and Spezialschwarz (registered trademark) 4 (Degussa).

From the viewpoint of improving engraving sensitivity by efficiently transmitting heat generated by photothermal conversion to the surrounding polymer, etc., the carbon black that can be used in the present invention is preferably a conductive carbon black having a specific surface area of at least 150 $m^2/g$ and a DBP number of at least 150 mL/100 g.

This specific surface area is preferably at least 250 $m^2/g$, and particularly preferably at least 500 $m^2/g$. The DBP number is preferably at least 200 mL/100 g, and particularly preferably at least 250 mL/100 g. The above-mentioned carbon black may be acidic or basic carbon black. The carbon black is preferably basic carbon black. It is of course possible to use a mixture of different carbon blacks.

Conductive carbon black having a specific surface area of 150 to about 1,500 $m^2/g$ and a DBP number of 150 to about 550 mL/100 g is commercially available under names such as for example Ketjenblack (registered trademark) EC300J, Ketjenblack (registered trademark) EC600J (Akzo), Printex (registered trademark) XE (Degussa), Black Pearls (registered trademark) 2000 (Cabot), and Ketjen Black (Lion Corporation).

When carbon black is used as the photothermal conversion agent, thermal crosslinking is more preferable in point of the curability of the film, instead of the photo crosslinking using UV light etc., and, by the combination with the organic peroxide being the polymerization initiator, which is the aforementioned preferable component for use in combination, the engraving sensitivity becomes extremely high, more preferably.

As the most preferable embodiment of the present invention, as described above, an embodiment, in which (Component C) a binder polymer, furthermore a polymer having a glass transition temperature of 20° C. or more as a binder polymer for use in combination, an organic peroxide being the crosslinking accelerator and carbon black being (Component F) a photothermal conversion agent are used in combination, can be cited.

The content of the photothermal conversion agent in the resin composition for laser engraving of the present invention largely depends on the size of the molecular extinction coefficient characteristic to the molecule, and is preferably 0.01 to 20 wt % relative to the total weight of the solids content of the resin composition, more preferably 0.05 to 10 wt %, and yet more preferably 0.1 to 5 wt %.

<Other Additives>

To the resin composition for laser engraving of the present invention, various additives used usually in the field of rubber can appropriately be added in a range that does not hinder the effect of the present invention. For example, a filler, a plasticizer, wax, a process oil, a metal oxide, an ozone decomposition inhibitor, an antioxidant, a thermal polymerization inhibitor, a colorant, etc. are cited, which may be used in one kind independently or in two or more kinds in combination.

A plasticizer, a cosensitizer or a colorant may also be added, and specific examples thereof are described in JP-A-2010-69763, paragraphs 0276 to 0303.

(Relief Printing Plate Precursor for Laser Engraving)

A first embodiment of the relief printing plate precursor for laser engraving of the present invention comprises a relief-forming layer formed from the resin composition for laser engraving of the present invention.

A second embodiment of the relief printing plate precursor for laser engraving of the present invention comprises a crosslinked relief-forming layer formed by crosslinking a relief-forming layer formed from the resin composition for laser engraving of the present invention.

In the present invention, the 'relief printing plate precursor for laser engraving' means both or one of a relief printing plate precursor having a crosslinkable relief-forming layer formed from the resin composition for laser engraving in a state before being crosslinked and a relief printing plate precursor in a state in which it is cured by light or heat.

In the present invention, the 'relief-forming layer' means a layer in a state before being crosslinked, that is, a layer formed from the resin composition for laser engraving of the present invention, which may be dried as necessary.

In the present invention, the "crosslinked relief-forming layer" refers to a layer obtained by crosslinking the aforementioned relief-forming layer. The crosslinking can be performed by light and/or heat, and the crosslinking by heat is preferable. Moreover, the crosslinking is not particularly limited only if it is a reaction that cures the resin composition, and is a general idea that includes the crosslinked structure by the reaction of ethylenically unsaturated compounds of Component B with each other, the reaction of the binder polymer of Component C with the compound comprising a silyl group etc. of Component D, and the reaction of Components D with each other. The crosslinked structure is preferably formed by the reaction of Component A with Component B, the reaction of Components B with each other, and the reaction of Component C with Component D.

A relief printing plate precursor for laser engraving of the present invention comprises a relief-forming layer formed from the resin composition for laser engraving of the present invention, which has the above-mentioned components. The (crosslinked) relief-forming layer is preferably provided above a support.

The (crosslinked) relief printing plate precursor for laser engraving may further comprise, as necessary, an adhesive layer between the support and the (crosslinked) relief-forming layer and, above the relief-forming layer, a slip coat layer and a protection film.

<Relief-Forming Layer>

The relief-forming layer is a layer formed from the resin composition for laser engraving of the present invention, and is preferably crosslinkable by heat.

As a mode in which a relief printing plate is prepared using the relief printing plate precursor for laser engraving, a mode in which a relief printing plate is prepared by crosslinking a relief-forming layer to thus form a relief printing plate precursor having a crosslinked relief-forming layer, and the crosslinked relief-forming layer (hard relief-forming layer) is then laser-engraved to thus form a relief layer is preferable. By crosslinking the relief-forming layer, it is possible to prevent abrasion of the relief layer during printing, and it is possible to obtain a relief printing plate having a relief layer with a sharp shape after laser engraving.

The relief-forming layer may be formed by molding the resin composition for laser engraving that has the above-mentioned components for a relief-forming layer into a sheet shape or a sleeve shape. The relief-forming layer is usually provided above a support, which is described later, but it may be formed directly on the surface of a member such as a cylinder of equipment for plate producing or printing or may be placed and immobilized thereon, and a support is not always required.

A case in which the relief-forming layer is mainly formed in a sheet shape is explained as an Example below.

<Support>

A material used for the support of the relief printing plate precursor for laser engraving is not particularly limited, but one having high dimensional stability is preferably used, and examples thereof include metals such as steel, stainless steel, or aluminum, plastic resins such as a polyester (e.g. polyethylene terephthalate (PET), polybutylene terephthalate (PBT), or polyacrylonitrile (PAN)) or polyvinyl chloride, synthetic rubbers such as styrene-butadiene rubber, and glass fiber-reinforced plastic resins (epoxy resin, phenolic resin, etc.). As the support, a PET film or a steel substrate is preferably used. The configuration of the support depends on whether the relief-forming layer is in a sheet shape or a sleeve shape.

<Adhesive Layer>

An adhesive layer may be provided between the relief-forming layer and the support for the purpose of strengthening the adhesion between the two layers. Examples of materials (adhesives) that can be used in the adhesive layer include those described in 'Handbook of Adhesives', Second Edition, Ed by I. Skeist, (1977).

<Protection Film, Slip Coat Layer>

For the purpose of preventing scratches or dents in the relief-forming layer surface or the crosslinked relief-forming layer surface, a protection film may be provided on the relief-forming layer surface or the crosslinked relief-forming layer surface. The thickness of the protection film is preferably 25 to 500 µm, and more preferably 50 to 200 µm. The protection film may employ, for example, a polyester-based film such as PET or a polyolefin-based film such as PE (polyethylene) or PP (polypropylene). The surface of the film may be made matte. The protection film is preferably peelable.

When the protection film is not peelable or conversely has poor adhesion to the relief-forming layer, a slip coat layer may be provided between the two layers. The material used in the slip coat layer preferably employs as a main component a resin that is soluble or dispersible in water and has little tackiness, such as polyvinyl alcohol, polyvinyl acetate, partially saponified polyvinyl alcohol, a hydroxyalkylcellulose, an alkylcellulose, or a polyimide resin.

<Process for Producing Relief Printing Plate Precursor for Laser Engraving>

Formation of a relief-forming layer in the relief printing plate precursor for laser engraving is not particularly limited, and examples thereof include a method in which a resin composition for laser engraving is prepared, solvent is removed from this coating solution composition for laser engraving, and it is then melt-extruded onto a support. Alternatively, a method may be employed in which a resin composition for laser engraving is cast onto a support, and this is dried in an oven to thus remove solvent from the resin composition.

Among them, the process for producing a relief printing plate precursor for laser engraving of the present invention is preferably a production process comprising a layer formation step of forming a relief-forming layer from the resin composition for laser engraving of the present invention and a crosslinking step of crosslinking the relief-forming layer by means of heat and/or light to thus obtain a relief printing plate precursor having a crosslinked relief-forming layer.

Subsequently, as necessary, a protection film may be laminated on the relief-forming layer. Laminating may be carried out by compression-bonding the protection film and the relief-forming layer by means of heated calendar rollers, etc. or putting a protection film into intimate contact with a relief-forming layer whose surface is impregnated with a small amount of solvent.

When a protection film is used, a method in which a relief-forming layer is first layered on a protection film and a support is then laminated may be employed.

When an adhesive layer is provided, it may be dealt with by use of a support coated with an adhesive layer. When a slip coat layer is provided, it may be dealt with by use of a protection film coated with a slip coat layer.

<Layer Formation Step>

The process for producing the relief printing plate for laser engraving of the present invention preferably comprises a layer formation step of forming a relief-forming layer from the resin composition for laser engraving of the present invention.

Preferred examples of a method for forming the relief-forming layer include a method in which the resin composition for laser engraving of the present invention is prepared, solvent is removed as necessary from this resin composition for laser engraving, and it is then melt-extruded onto a support and a method in which the resin composition for laser engraving of the present invention is prepared, the resin composition for laser engraving of the present invention is cast onto a support, and this is dried in an oven to thus remove solvent.

The resin composition for laser engraving may be produced by, for example, dissolving Components A, B, C, D, and as optional components, a vulcanizing agent, a fragrance, and a plasticizer in an appropriate solvent, and then dissolving a polymerizable compound and a polymerization initiator. It is necessary to remove most of the solvent component in a stage of producing a relief printing plate precursor. It is preferable to use as the solvent a volatile one such as low molecular weight alcohol (for example, methanol, ethanol, n-propanol, isopropanol, propylene glycol monomethyl-ether) and adjust the temperature, etc. to thus reduce as much as possible the total amount of solvent to be added.

The thickness of the (crosslinked) relief-forming layer in the relief printing plate precursor for laser engraving is preferably 0.05 to 10 mm before and after crosslinking, more preferably 0.05 to 7 mm, and yet more preferably 0.05 to 3 mm.

<Crosslinking Step>

The process for producing a relief printing plate for laser engraving of the present invention is preferably a production process comprising a crosslinking step of crosslinking the relief-forming layer by means of heat to thus obtain a relief printing plate precursor having a crosslinked relief-forming layer.

The relief-forming layer may be crosslinked by heating the relief printing plate precursor for laser engraving (step of crosslinking by means of heat). As heating means for carrying out crosslinking by heat, there can be cited a method in which a printing plate precursor is heated in a hot air oven or a far-infrared oven for a predetermined period of time and a method in which it is put into contact with a heated roller for a predetermined period of time.

Due to the relief-forming layer being thermally crosslinked, firstly, a relief formed after laser engraving becomes sharp and, secondly, tackiness of engraving residue formed when laser engraving is suppressed.

No particular limitation is imposed on the method for measuring the vulcanizing characteristics of the crosslinked relief-forming layer and the relief layer, including, for example, a curast test. Moreover, as methods for measuring typical characteristics in the field of rubber such as tensile strength (25° C.), breaking elongation (25° C.) and stress value (100% elongation), measurement methods described in JIS can be referred to.

(Relief Printing Plate and Process for Producing Same)

The process for producing a relief printing plate of the present invention preferably comprises a layer formation step of forming a relief-forming layer from the resin composition for laser engraving of the present invention, a crosslinking step of crosslinking the relief-forming layer by means of heat to thus obtain a relief printing plate precursor having a crosslinked relief-forming layer, and an engraving step of laser-engraving the relief printing plate precursor having the crosslinked relief-forming layer.

The relief printing plate of the present invention is a relief printing plate having a relief layer obtained by crosslinking and laser-engraving a layer formed from the resin composition for laser engraving of the present invention, and is preferably a relief printing plate made by the process for producing a relief printing plate of the present invention.

The relief printing plate of the present invention may suitably employ an aqueous ink when printing.

The layer formation step and the crosslinking step in the process for producing a relief printing plate of the present invention mean the same as the layer formation step and the crosslinking step in the above-mentioned process for producing a relief printing plate precursor for laser engraving, and preferred ranges are also the same.

<Engraving Step>

The process for producing a relief printing plate of the present invention preferably comprises an engraving step of laser-engraving the relief printing plate precursor having a crosslinked relief-forming layer.

The engraving step is a step of laser-engraving a crosslinked relief-forming layer that has been crosslinked in the crosslinking step to thus form a relief layer. Specifically, it is preferable to engrave a crosslinked relief-forming layer that has been crosslinked by irradiation with laser light according to a desired image, thus forming a relief layer. Furthermore, a step in which a crosslinked relief-forming layer is subjected to scanning irradiation by controlling a laser head using a computer in accordance with digital data of a desired image can preferably be cited.

This engraving step preferably employs an infrared laser. When irradiated with an infrared laser, molecules in the crosslinked relief-forming layer undergo molecular vibration, thus generating heat. When a high power laser such as a carbon dioxide laser or a YAG laser is used as the infrared laser, a large quantity of heat is generated in the laser-irradiated area, and molecules in the crosslinked relief-forming layer undergo molecular scission or ionization, thus being selectively removed, that is, engraved. The advantage of laser engraving is that, since the depth of engraving can be set freely, it is possible to control the structure three-dimensionally. For example, for an area where fine halftone dots are printed, carrying out engraving shallowly or with a shoulder prevents the relief from collapsing due to printing pressure, and for a groove area where a fine outline character is printed, carrying out engraving deeply makes it difficult for ink the groove to be blocked with ink, thus enabling breakup of an outline character to be suppressed.

In particular, when engraving is carried out using an infrared laser that corresponds to the absorption wavelength of the photothermal conversion agent, it becomes possible to selectively remove the crosslinked relief-forming layer at higher sensitivity, thus giving a relief layer having a sharp image.

As the infrared laser used in the engraving step, from the viewpoint of productivity, cost, etc., a carbon dioxide laser or a semiconductor laser is preferable. In particular, a fiber-coupled semiconductor infrared laser is preferably used. In general, compared with a CO2 laser, a semiconductor laser has higher efficiency laser oscillation, is less expensive, and can be made smaller. Furthermore, it is easy to form an array due to the small size. Moreover, the shape of the beam can be controlled by treatment of the fiber.

With regard to the semiconductor laser, one having a wavelength of 700 to 1,300 nm is preferable, one having a wavelength of 800 to 1,200 nm is more preferable, one having a wavelength of 860 to 1,200 nm is further preferable, and one having a wavelength of 900 to 1,100 nm is particularly preferable.

Furthermore, the fiber-coupled semiconductor laser can output laser light efficiently by being equipped with optical fiber, and this is effective in the engraving step in the present invention. Moreover, the shape of the beam can be controlled by treatment of the fiber. For example, the beam profile may be a top hat shape, and energy can be applied stably to the plate face. Details of semiconductor lasers are described in 'Laser Handbook $2^{nd}$ Edition' The Laser Society of Japan, Applied Laser Technology, The Institute of Electronics and Communication Engineers, etc.

Moreover, as plate producing equipment comprising a fiber-coupled semiconductor laser that can be used suitably in the process for producing a relief printing plate employing the relief printing plate precursor of the present invention, those described in detail in JP-A-2009-172658 and JPA-2009-214334 can be cited. Such equipment comprising a fiber-coupled semiconductor laser can be used to produce a relief printing plate of the present invention.

The process for producing a relief printing plate of the present invention may as necessary further comprise, subsequent to the engraving step, a rinsing step, a drying step, and/or a post-crosslinking step, which are shown below.

Rinsing step: a step of rinsing the engraved surface by rinsing the engraved relief layer surface with water or a liquid comprising water as a main component.

Drying Step: A Step of Drying the Engraved Relief Layer.

Post-crosslinking step: a step of further crosslinking the relief layer by applying energy to the engraved relief layer.

After the above-mentioned step, since engraving residue is attached to the engraved surface, a rinsing step of washing off engraving residue by rinsing the engraved surface with water or a liquid comprising water as a main component may be added. Examples of rinsing means include a method in which washing is carried out with tap water, a method in which high pressure water is spray-jetted, and a method in which the engraved surface is brushed in the presence of mainly water using a batch or conveyor brush type washout machine known as a photosensitive resin letterpress plate processor, and when slime due to engraving residue cannot be eliminated, a rinsing liquid to which a soap or a surfactant is added may be used.

When the rinsing step of rinsing the engraved surface is carried out, it is preferable to add a drying step of drying an engraved relief-forming layer so as to evaporate rinsing liquid.

Furthermore, as necessary, a post-crosslinking step for further crosslinking the relief-forming layer may be added. By carrying out a post-crosslinking step, which is an additional crosslinking step, it is possible to further strengthen the relief formed by engraving.

The pH of the rinsing liquid that can be used in the present invention is preferably at least 9, more preferably at least 10, and yet more preferably at least 11. The pH of the rinsing liquid is preferably no greater than 14, more preferably no greater than 13.5, and yet more preferably no greater than 13.2, and especially preferably no greater than 13.0. When in the above-mentioned range, handling is easy.

In order to set the pH of the rinsing liquid in the above-mentioned range, the pH may be adjusted using an acid and/or a base as appropriate, and the acid or base used is not particularly limited.

The rinsing liquid that can be used in the present invention preferably comprises water as a main component.

The rinsing liquid may contain as a solvent other than water a water-miscible solvent such as an alcohol, acetone, or tetrahydrofuran.

The rinsing liquid preferably comprises a surfactant.

From the viewpoint of removability of engraving residue and little influence on a relief printing plate, preferred examples of the surfactant that can be used in the present invention include betaine compounds (amphoteric surfactants) such as a carboxybetaine compound, a sulfobetaine compound, a phosphobetaine compound, an amine oxide compound, and a phosphine oxide compound.

Furthermore, examples of the surfactant also include known anionic surfactants, cationic surfactants, and nonionic surfactants. Moreover, a fluorine-based or silicone-based nonionic surfactant may also be used in the same manner.

With regard to the surfactant, one type may be used on its own or two or more types may be used in combination.

It is not necessary to particularly limit the amount of surfactant used, but it is preferably 0.01 to 20 wt % relative to the total weight of the rinsing liquid, and more preferably 0.05 to 10 wt %.

The relief printing plate of the present invention having a relief layer may be produced as described above.

From the viewpoint of satisfying suitability for various aspects of flexographic printing, such as abrasion resistance and ink transfer properties, the thickness of the relief layer of the relief printing plate is preferably at least 0.05 mm but no greater than 10 mm, more preferably at least 0.05 mm but no greater than 7 mm, and yet more preferably at least 0.05 mm but no greater than 0.3 mm.

Furthermore, the Shore A hardness of the relief layer of the relief printing plate is preferably at least 50° but no greater than 90°. When the Shore A hardness of the relief layer is at least 50°, even if fine halftone dots formed by engraving receive a strong printing pressure from a letterpress printer, they do not collapse and close up, and normal printing can be carried out. Furthermore, when the Shore A hardness of the relief layer is no greater than 90°, even for flexographic printing with kiss touch printing pressure it is possible to prevent patchy printing in a solid printed part.

The Shore A hardness in the present specification is a value measured by a durometer (a spring type rubber hardness meter) that presses an indenter (called a pressing needle or indenter) into the surface of a measurement target at 25° C. so as to deform it, measures the amount of deformation (indentation depth), and converts it into a numerical value.

The relief printing plate of the present invention is particularly suitable for printing by a flexographic printer using an aqueous ink, but printing is also possible when it is carried out by a letterpress printer using any of aqueous, oil-based, and UV inks, and printing is also possible when it is carried out by a flexographic printer using a UV ink. The relief printing plate of the present invention has excellent rinsing properties, there is no engraving residue, since a relief layer obtained has excellent elasticity aqueous ink transfer properties and printing durability are excellent, and printing can be carried out for a long period of time without plastic deformation of the relief layer or degradation of printing durability.

In accordance with the present invention, there can be provided a resin composition for laser engraving that can give a relief printing plate having excellent hardness, film elasticity, printing durability, and ink adhering property and that has excellent rinsing properties for engraving residue generated when laser-engraving a printing plate precursor and excellent engraving sensitivity in laser engraving, a relief printing plate precursor, a process for producing a relief printing plate employing same, and a relief printing plate.

EXAMPLES

Example 1

1. Preparation of Resin Composition for Laser Engraving

In a three-neck flask equipped with a stirrer blade and a cooling tube, 40 parts of Denka Butyral #3000-2 (polyvinyl butyral, manufactured by Denki Kagaku Kogyo K.K.) as (Component C) a binder polymer, 0.75 parts of ketjen black EC600JD (F-1) (manufactured by Lion Corporation) as (Component F) a photothermal conversion agent, 20 parts of RS-540 (manufactured by ADEKA) as a plasticizer, 47 parts of propylene glycol monomethyl ether acetate as a solvent were charged, which was heated at 70° C. for 2 hr with stirring to dissolve the polymer. In addition, 10.9 parts of A-1 (manufactured by Wako Pure Chemical Industries, Ltd.) as (Component A) a compound having at least two mercapto groups, 9.1 parts of B-4 (manufactured by TOKYO KASEI KOGYO CO., LTD.; Component A and Component B are in the equivalent molar ratio) as (Component B) an ethylenically unsaturated compound, 2 parts of D-1 (KBE-846, manufactured by Shin-Etsu Chemical Co., Ltd.) as (Component D) a silane compound, and 1 part of Perbutyl Z (manufactured by NOF CORPORATION) and 1 part of DBU (manufactured by Wako Pure Chemical Industries, Ltd.) as (Component E) a crosslinking accelerator were added, which was stirred for 30 min to give a flowable solution of a resin composition for laser engraving for forming a relief-forming layer.

2. Formation of Crosslinked Relief-Forming Layer

On a PET substrate, a spacer (frame) having a prescribed thickness was disposed, and the solution of the resin composition obtained as described above was calmly cast to such degree that the solution did not overflow from the spacer (frame), and the solution was dried in an oven at 70° C. for 3 hr to provide a relief-forming layer precursor of approximately 1 mm in thickness.

Subsequently, the support on which the relief-forming layer precursor was formed was heated at 100° C. for 3 hr to crosslink thermally the relief-forming layer to give the relief printing plate precursor for laser engraving in Example 1.

The thickness and Shore A hardness of the relief-forming layer that belonged to the relief printing plate precursor were measured. Results are shown in Table 1. Meanwhile, the Shore A hardness of the relief-forming layer was measured by a measurement method to be described later. Moreover, in respective Examples and Comparative Examples to be described later, the Shore A hardness etc. were measured in the same manner.

Examples 2 to 41, Comparative Examples 1 and 2

The same procedure as in Example 1 was repeated to prepare resin compositions for laser engraving in Examples 2 to 41 and Comparative Examples 1 and 2, except that Components A, B, C, D, E and F as shown in Table 1 were used, and, subsequently relief-forming layers were obtained by crosslinking.

Meanwhile, Component A and Component B were formulated so as to give molar ratios of the mercapto group and the ethylenically unsaturated group, which are respective functional groups, as shown in Table 1, and to give the summed weight of 20 parts. Components C, D, E and F were set to give the same weight part as that in Example 1.

Meanwhile, the compound used as Component A was selected from the exemplified compounds as listed above.

The compound used as Component B was selected from exemplified compounds B-1 to 22 as listed above.

As Component C, compounds below were used.
3000-2: Denka Butyral #3000-2
PMMA: methyl polymethacrylate (Mw=50,000)
TR-2000: styrene-butadiene rubber (SBR) manufactured by JSR As Component D, compounds below were used.

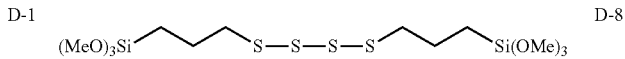

D-1

D-8

D-22

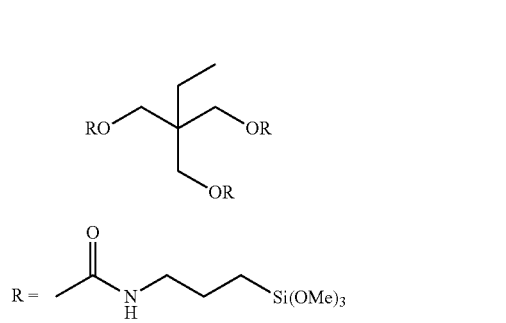

D-18

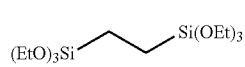

D-25

-continued

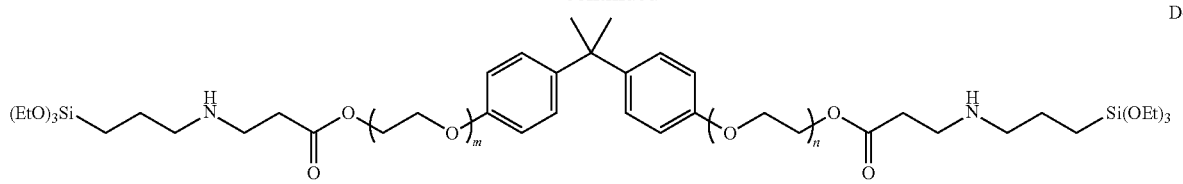

D-29 m + n = 4

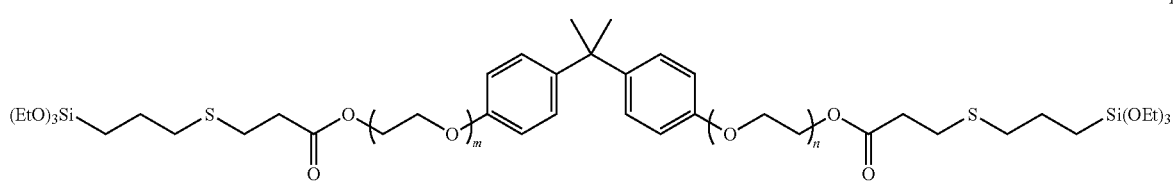

D-30 m + n = 4

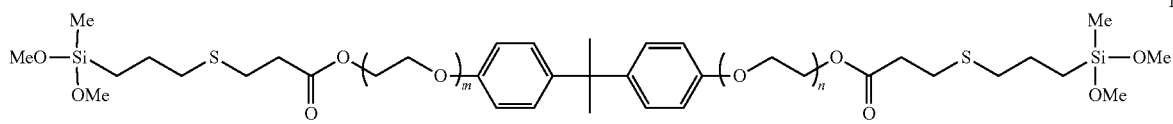

D-32 m + n = 10

As Component E, compounds below were used.

E1: Perbutyl Z (manufactured by NOF CORPORATION)

E2: 1,8-diazabicyclo[5.4.0]undeca-7-ene (manufactured by Wako Pure Chemical Industries, Ltd.)

E3: phosphoric acid (manufactured by Wako Pure Chemical Industries, Ltd.)

As Component F, as described above, the material below was used.

F1: ketjen black EC600JD (manufactured by Lion Corporation)

4. Evaluation of Relief Printing Plate

Evaluation of relief printing plate performance was carried out for the items below, and the results are summarized in Table 2.

(4-1) Ink Transfer Property

A relief printing plate that had been obtained was set in a printer (Model ITM-4, Iyo Kikai Seisakujo Co., Ltd.), printing was continued using the aqueous ink Aqua SPZ16 rouge (Toyo Ink Mfg. Co., Ltd.) as an ink without dilution and Full Color Form M 70 (Nippon Paper Industries Co., Ltd., thickness 100 μm) as printing paper, and 1% to 10% highlights were checked for the printed material. The degree of ink attachment of a solid printed part on the printed material at a paper length (meters) of 500 m and 1,000 m from the start of printing was compared by visual inspection.

One that was uniform without unevenness in density was evaluated as Good, and one with unevenness in actual application was evaluated as Poor.

(4-2) Printing Durability

A relief printing plate that had been obtained was set in a printer (ITM-4 type, Iyo Kikai Seisakujo Co., Ltd.), printing was continued using the aqueous ink Aqua SPZ16 rouge (Toyo Ink Mfg. Co., Ltd.) as an ink without dilution and Full Color Form M 70 (Nippon Paper Industries Co., Ltd., thickness 100 μm) as printing paper, and 1% to 10% highlights were checked for the printed material. Completion of printing was defined as being when a halftone dot was not printed, and the length (meters) of paper printed up to the completion of printing was used as an index. The larger the value for the length of paper, the better the evaluation of printing durability.

(4-3) Rinsing Properties

A rinsing liquid was prepared by mixing water, a 10 wt % aqueous solution of sodium hydroxide, and betaine compound (1-B) below so that the pH was 12 and the content of betaine compound (1-B) was 1 wt % of the total rinsing liquid.

(1-B)

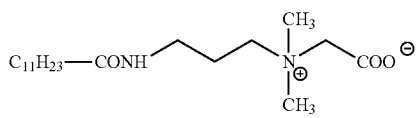

The rinsing liquid thus prepared was dropped (about 100 mL/m$^2$) by means of a pipette onto a plate material engraved by the above-mentioned method so that the plate surface became uniformly wet, was allowed to stand for 1 min, and rubbed using a toothbrush (Clinica Toothbrush Flat, Lion Corporation) 20 times (30 sec) in parallel to the plate with a load of 200 gf. Subsequently, the plate face was washed with running water, moisture of the plate face was removed, and it was naturally dried for approximately 1 hour.

The surface of a plate after the rinse was observed with a microscope having a magnification of 100 (manufactured by Keyence Corporation) and left residues on the plate were evaluated. The result was denoted by:

A: no residue
B: almost no residue
C: a little amount of residue
D: residues were not removed.

(4-4) Engraving Depth

The 'engraving depth' of a relief layer obtained by laser engraving a crosslinked relief-forming layer of a relief printing plate precursor of each of the Examples and Comparative Examples was measured as follows. The 'engraving depth' referred to here means the difference between an engraved position (height) and an unengraved position (height) when a cross-section of the relief layer was examined. The 'engraving depth' in the present Examples was measured by examining a cross-section of a relief layer using a VK9510 ultradepth color 3D profile measurement microscope (Keyence). A large engraving depth means a high engraving sensitivity. The results of engraving depth in μm are given in Table 2 for either the $CO_2$ laser or FC-LD laser used for engraving.

(4-4) Shore A Hardness

Shore A hardness was measured by a durometer (a spring type rubber hardness meter) that presses an indenter into the surface of a measurement target at 25° C. so as to deform it, measures the amount of deformation (indentation depth), and shown the value as °.

TABLE 1

| | Component A | | Component B | | | | | | |
|---|---|---|---|---|---|---|---|---|---|
| | Kind | Number of functional group | Kind | Number of functional group | Component A/Component B (molar ratio) | Component C | Component D | Component E | Component F |
| Example 1 | A-1 | 2 | B-4 | 2 | 1/1 | #3000-2 | D-1 | E1/E2 | F1 |
| Example 2 | A-2 | 3 | B-4 | 2 | 1/1 | #3000-2 | D-1 | E1/E2 | F1 |
| Example 3 | A-4 | 4 | B-4 | 2 | 1/1 | #3000-2 | D-1 | E1/E2 | F1 |
| Example 4 | A-5 | 6 | B-4 | 2 | 1/1 | #3000-2 | D-1 | E1/E2 | F1 |
| Example 5 | A-8 | 4 | B-4 | 2 | 1/1 | #3000-2 | D-1 | E1/E2 | F1 |
| Example 6 | A-9 | 2 | B-4 | 2 | 1/1 | #3000-2 | D-1 | E1/E2 | F1 |
| Example 7 | A-1 | 2 | B-17 | 2 | 1/1 | #3000-2 | D-1 | E1/E2 | F1 |
| Example 8 | A-2 | 3 | B-17 | 2 | 1/1 | #3000-2 | D-1 | E1/E2 | F1 |
| Example 10 | A-4 | 4 | B-17 | 2 | 1/1 | #3000-2 | D-1 | E1/E2 | F1 |
| Example 11 | A-5 | 6 | B-17 | 2 | 1/1 | #3000-2 | D-1 | E1/E2 | F1 |
| Example 12 | A-8 | 4 | B-17 | 2 | 1/1 | #3000-2 | D-1 | E1/E2 | F1 |
| Example 13 | A-9 | 2 | B-17 | 2 | 1/1 | #3000-2 | D-1 | E1/E2 | F1 |
| Example 14 | A-2 | 3 | B-3 | 2 | 1/1 | #3000-2 | D-1 | E1/E2 | F1 |
| Example 15 | A-2 | 3 | B-7 | 4 | 1/1 | #3000-2 | D-1 | E1/E2 | F1 |
| Example 16 | A-2 | 3 | B-11 | 3 | 1/1 | #3000-2 | D-1 | E1/E2 | F1 |
| Example 17 | A-2 | 3 | B-14 | 2 | 1/1 | #3000-2 | D-1 | E1/E2 | F1 |
| Example 18 | A-2 | 3 | B-15 | 2 | 1/1 | #3000-2 | D-1 | E1/E2 | F1 |
| Example 19 | A-2 | 3 | B-16 | 2 | 1/1 | #3000-2 | D-1 | E1/E2 | F1 |
| Example 20 | A-2 | 3 | B-19 | 3 | 1/1 | #3000-2 | D-1 | E1/E2 | F1 |
| Example 21 | A-2 | 3 | B-20 | 4 | 1/1 | #3000-2 | D-1 | E1/E2 | F1 |
| Example 22 | A-2 | 3 | B-21 | 4 | 1/1 | #3000-2 | D-1 | E1/E2 | F1 |
| Example 23 | A-2 | 3 | B-22 | 6 | 1/1 | #3000-2 | D-1 | E1/E2 | F1 |
| Example 24 | A-2 | 3 | B-17 | 2 | 1/1 | #3000-2 | D-1 | None | F1 |
| Example 25 | A-2 | 3 | B-17 | 2 | 1/1 | #3000-2 | D-1 | E1 (1 part) | F1 |
| Example 26 | A-2 | 3 | B-17 | 2 | 1/1 | #3000-2 | D-1 | E2 (1 part) | F1 |
| Example 27 | A-2 | 3 | B-17 | 2 | 1/1 | #3000-2 | D-1 | E3 (1 part) | F1 |
| Example 28 | A-2 | 3 | B-17 | 2 | 1/1 | #3000-2 | D-1 | E1/E2 | None |
| Example 29 | A-2 | 3 | B-17 | 2 | 1/1 | #3000-2 | D-1 | None | None |
| Example 30 | A-2 | 3 | B-17 | 2 | 1/1 | #3000-2 | D-8 | E1/E2 | F1 |
| Example 31 | A-2 | 3 | B-17 | 2 | 1/1 | #3000-2 | D-22 | E1/E2 | F1 |
| Example 32 | A-2 | 3 | B-17 | 2 | 1/1 | #3000-2 | D-25 | E1/E2 | F1 |
| Example 33 | A-2 | 3 | B-17 | 2 | 1/1 | #3000-2 | D-30 | E1/E2 | F1 |
| Example 34 | A-2 | 3 | B-17 | 2 | 1/1 | #3000-2 | D-32 | E1/E2 | F1 |
| Example 35 | A-2 | 3 | B-17 | 2 | 1/2 | #3000-2 | D-1 | E1/E2 | F1 |
| Example 36 | A-2 | 3 | B-17 | 2 | 1/5 | #3000-2 | D-1 | E1/E2 | F1 |
| Example 37 | A-2 | 3 | B-17 | 2 | 1/10 | #3000-2 | D-1 | E1/E2 | F1 |
| Example 38 | A-2 | 3 | B-17 | 2 | 1/1 | PMMA | D-1 | E1/E2 | F1 |
| Example 39 | A-2 | 3 | B-17 | 2 | 1/1 | TR-2000 | D-1 | E1/E2 | F1 |
| Example 40 | A-2 | 3 | B-17 | 2 | 1/1 | #3000-2 | D-18 | E1/E2 | F1 |
| Example 41 | A-2 | 3 | B-17 | 2 | 1/1 | #3000-2 | D-29 | E1/E2 | F1 |
| Comp. Ex. 1 | None | 0 | B-17 | 2 | 0/1 | #3000-2 | D-1 | E1/E2 | F1 |
| Comp. Ex. 2 | A-2 | 3 | B-17 | 2 | 1/1 | #3000-2 | None | E1/E2 | F1 |

TABLE 2

| | Film thickness (mm) | Ink transfer property | Printing durability (m) | Rinsing property | Engraving depth $CO_2$ laser (μm) | Engraving depth FC-LD (μm) | Shore A hardness (°) |
|---|---|---|---|---|---|---|---|
| Example 1 | 1.1 | Good | 1,500 | B | 405 | 324 | 70 |
| Example 2 | 1.0 | Good | 1,900 | B | 400 | 320 | 75 |
| Example 3 | 1.2 | Good | 2,000 | B | 405 | 324 | 60 |
| Example 4 | 1.0 | Good | 2,100 | B | 410 | 328 | 65 |
| Example 5 | 1.1 | Good | 2,000 | B | 400 | 320 | 70 |

TABLE 2-continued

| | Film thickness (mm) | Ink transfer property | Printing durability (m) | Rinsing property | Engraving depth CO$_2$ laser (μm) | Engraving depth FC-LD (μm) | Shore A hardness (°) |
|---|---|---|---|---|---|---|---|
| Example 6 | 0.9 | Good | 1,500 | B | 405 | 324 | 75 |
| Example 7 | 1.2 | Good | 1,600 | B | 410 | 328 | 70 |
| Example 8 | 1.2 | Good | 1,900 | B | 400 | 320 | 65 |
| Example 10 | 1.1 | Good | 2,000 | B | 405 | 324 | 70 |
| Example 11 | 1.1 | Good | 2,100 | B | 400 | 320 | 75 |
| Example 12 | 0.9 | Good | 2,000 | B | 400 | 320 | 65 |
| Example 13 | 1.0 | Good | 1,500 | B | 395 | 316 | 70 |
| Example 14 | 1.2 | Good | 1,700 | B | 400 | 320 | 70 |
| Example 15 | 0.9 | Good | 2,000 | B | 400 | 320 | 60 |
| Example 16 | 0.9 | Good | 2,100 | B | 400 | 320 | 65 |
| Example 17 | 1.0 | Good | 1,700 | B | 400 | 320 | 70 |
| Example 18 | 1.1 | Good | 1,600 | B | 400 | 320 | 65 |
| Example 19 | 0.9 | Good | 1,700 | B | 405 | 324 | 60 |
| Example 20 | 1.0 | Good | 2,000 | B | 400 | 320 | 70 |
| Example 21 | 1.1 | Good | 2,000 | B | 395 | 316 | 65 |
| Example 22 | 0.9 | Good | 2,100 | B | 400 | 320 | 70 |
| Example 23 | 1.1 | Good | 2,000 | B | 410 | 328 | 65 |
| Example 24 | 1.1 | Good | 1,700 | B | 400 | 320 | 60 |
| Example 25 | 1.2 | Good | 1,800 | B | 400 | 320 | 60 |
| Example 26 | 1.0 | Good | 1,800 | B | 400 | 320 | 70 |
| Example 27 | 0.9 | Good | 1,800 | B | 400 | 320 | 75 |
| Example 28 | 0.9 | Good | 1,900 | B | 360 | 288 | 75 |
| Example 29 | 1.1 | Good | 1,700 | B | 360 | 288 | 60 |
| Example 30 | 1.2 | Good | 1,900 | B | 400 | 320 | 65 |
| Example 31 | 1.0 | Good | 1,700 | C | 395 | 316 | 55 |
| Example 32 | 1.1 | Good | 1,900 | B | 395 | 316 | 60 |
| Example 33 | 1.1 | Good | 1,900 | A | 410 | 328 | 70 |
| Example 34 | 0.9 | Good | 1,900 | A | 410 | 328 | 70 |
| Example 35 | 1.0 | Good | 1,900 | B | 400 | 320 | 60 |
| Example 36 | 1.0 | Good | 1,900 | B | 400 | 320 | 65 |
| Example 37 | 0.9 | Good | 1,800 | B | 400 | 320 | 65 |
| Example 38 | 1.0 | Good | 1,700 | B | 390 | 312 | 75 |
| Example 39 | 1.0 | Good | 1,600 | B | 380 | 304 | 55 |
| Example 40 | 1.1 | Good | 1,900 | B | 410 | 328 | 65 |
| Example 41 | 1.0 | Good | 1,900 | B | 405 | 324 | 60 |
| Comp. Ex. 1 | 1.0 | Poor | 1,400 | B | 400 | 320 | 65 |
| Comp. Ex. 2 | 1.0 | Good | 1,600 | D | 400 | 320 | 65 |

What is claimed is:

1. A process for making a relief printing plate, comprising the steps of:
   receiving a relief printing plate precursor having a crosslinked relief-forming layer obtained by thermally curing a layer formed from a resin composition comprising (Component A) a compound having at least two mercapto groups, (Component B) a compound having at least two ethylenically unsaturated groups, (Component C) a binder polymer and (Component D) a compound having at least one of a hydrolysable silyl group and a silanol group,
   laser-engraving the crosslinked relief-forming layer of the relief printing plate precursor to form a relief layer having an engraved surface; and
   rinsing the engraved surface of the relief layer with a rinsing liquid comprising water as a main component,
   wherein the rinsing liquid has a pH of at least 9 but no greater than 13.5.

2. The process for producing a relief printing plate according to claim 1, wherein said Component A is a compound denoted by Formula (a):

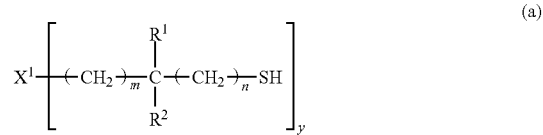

wherein $R^1$ and $R^2$ independently denote a hydrogen atom or an alkyl group having 1 to 10 carbon atoms, m is an integer of 0 to 2, n is 0 or 1, y denotes an integer of 2 or more, $X^1$ is a y-valent organic residue.

3. The process for producing a relief printing plate according to claim 1, wherein said Component C is at least one binder polymer selected from the group consisting of acrylic resin and polyvinyl butyral.

4. The process for producing a relief printing plate according to claim 1, wherein said Component C is a polyvinyl butyral.

5. The process for producing a relief printing plate according to claim 1, wherein said Component D is a compound having two or more hydrolyzable silyl groups.

6. The process for producing a relief printing plate according to claim 1, wherein said Component D is a compound having a hydrolyzable silyl group and the hydrolyzable silyl group is a group in which at least one alkoxy group or halogen atom is directly bonded to Si atom.

7. The process for producing a relief printing plate according to claim 6, wherein the hydrolyzable silyl group is a group in which at least one alkoxy group is directly bonded to a Si atom.

8. The process for making a relief printing plate according to claim 1, wherein the resin composition further comprises (Component E) a crosslinking accelerator.

9. The process for making a relief printing plate according to claim 8, wherein said Component E is one or more accelerator selected from the group consisting of a radical-generating agent, an acid, and a base.

10. The process for making a relief printing plate according to claim 9, wherein said Component E is a radical-generating agent.

11. The process for making a relief printing plate according to claim 1, wherein the resin composition further comprises (Component F) a photothermal conversion agent capable of absorbing light having a wavelength of 700 to 1,300 nm.

12. The process for producing a relief printing plate according to claim 1, wherein the thickness of the relief layer is at least 0.05 mm but no greater than 10 mm.

13. The process for producing a relief printing plate according to claim 1, wherein the Shore A hardness of the relief layer is from 50° to 90°.

14. The process for producing a relief printing plate according to claim 1, wherein the rinsing liquid has a pH of at least 11 but no greater than 13.2.

15. The process for producing a relief printing plate according to claim 1, wherein the rinsing liquid comprises a surfactant.

16. The process for producing a relief printing plate according to claim 15, wherein the rinsing liquid comprises an amphoteric surfactant.

* * * * *